US012694938B2

(12) United States Patent
Chen et al.

(10) Patent No.: US 12,694,938 B2
(45) Date of Patent: Jul. 28, 2026

(54) VALLEY SEARCH SCAN BIT LINE SELECTION METHOD TO ADDRESS MEMORY HOLE AND STRING PROCESS VARIATION

(71) Applicant: Western Digital Technologies, Inc., San Jose, CA (US)

(72) Inventors: Chin-Yi Chen, San Jose, CA (US); Ravi Kumar, Redwood City, CA (US); Deepanshu Dutta, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 188 days.

(21) Appl. No.: 18/219,456

(22) Filed: Jul. 7, 2023

(65) Prior Publication Data

US 2024/0194283 A1     Jun. 13, 2024

Related U.S. Application Data

(60) Provisional application No. 63/432,101, filed on Dec. 13, 2022.

(51) Int. Cl.
G11C 16/04 (2006.01)
G11C 29/12 (2006.01)

(52) U.S. Cl.
CPC .. G11C 29/1201 (2013.01); G11C 2029/1202 (2013.01)

(58) Field of Classification Search
CPC ... G11C 29/1201; G11C 29/28; G11C 29/021; G11C 2029/1202; G11C 16/0483; G11C 16/26; G11C 11/5642
See application file for complete search history.

(56) References Cited

U.S. PATENT DOCUMENTS

| | | | |
|---|---|---|---|
| 8,531,879 B2 | 9/2013 | Hwang | |
| 9,460,805 B1 * | 10/2016 | Pang | G11C 16/08 |
| 9,472,298 B1 * | 10/2016 | Louie | G11C 16/3459 |
| 9,659,636 B2 | 5/2017 | Lee | |
| 10,998,041 B1 * | 5/2021 | Avraham | G11C 29/4401 |
| 2014/0198573 A1 * | 7/2014 | Jung | G06F 11/1048 |
| | | | 365/185.12 |
| 2022/0093184 A1 | 3/2022 | Kim | |
| 2023/0343400 A1 * | 10/2023 | Guo | G11C 16/3459 |
| 2023/0393748 A1 * | 12/2023 | Lu | G06F 3/0659 |
| 2024/0177795 A1 * | 5/2024 | Chang | G11C 16/26 |

* cited by examiner

*Primary Examiner* — Mark D Featherstone
*Assistant Examiner* — Rong Tang
(74) *Attorney, Agent, or Firm* — Dickinson Wright PLLC

(57)          ABSTRACT

A memory apparatus and operating method are provided. The apparatus includes memory cells connected to one of a plurality of word lines and disposed in memory holes coupled to bit lines. The memory cells are configured to retain a threshold voltage corresponding to one of a plurality of data states. A control means is coupled to the plurality of word lines and the bit lines and for a group of the memory cells divided into a plurality of subsets, is configured to determine whether comparatively fewer read errors of the memory cells arise while pre-charging ones of the bit lines associated with each of the plurality of subsets. The control means is also configured to pre-charge ones of the bit lines associated with one the plurality of subsets with comparatively fewer read errors and read the memory cells associated therewith during a scan operation.

20 Claims, 23 Drawing Sheets

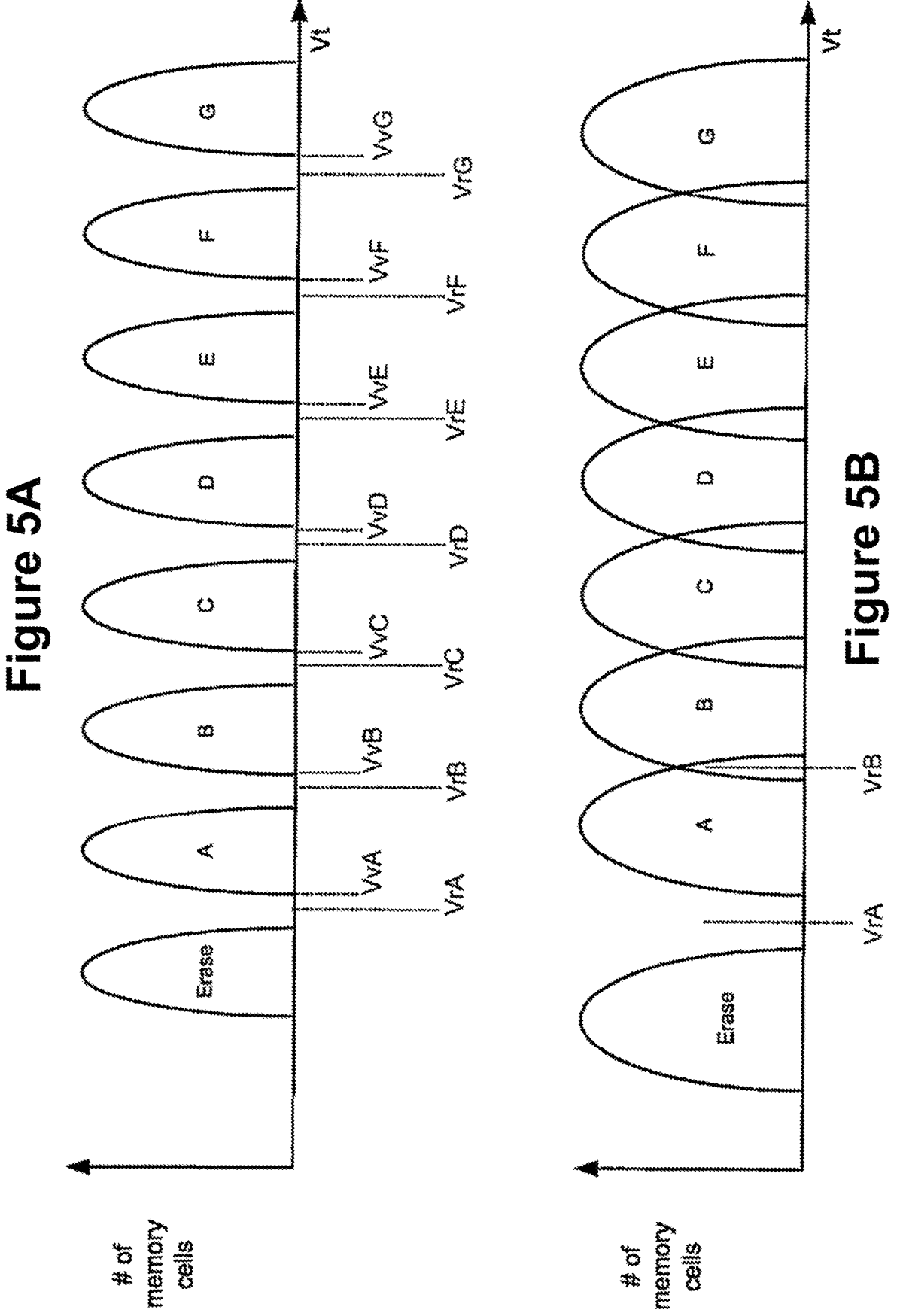

WL

757

RO    R1    R2    R3    R4    R5    R6    R7

C01  C12  C23  C34  C45  C56  C67

| MODE | F_PCHSEL_VS | READ ICC | READ SITUATION | NEIGHBOR BL NOISE | RANGE OF PRECHARGE | BITSCAN |
|---|---|---|---|---|---|---|
| PCHSEL W/ SHIELD BL | 1H | SMALL | DIFFERENT FROM NORMAL READ | GOOD | ACCORDING TO F_VSREAD_SMB | ACCORDING TO F_VSREAD_SMB |
| NO-LOCKOUT W/ ABL | 2H | LARGE | SAME AS NORMAL READ | BAD | 16K BLs | |

Figure 11

ADD=XX    VS_SCAN_BL_STR0

| [0] | OPTION |
|-----|--------|
| 0 | VS SCAN EVEN BL FOR STRING 0 |
| 1 | VS SCAN ODD BL FOR STRING 0 |

ADD=XX    VS_SCAN_BL_STR1

| [0] | OPTION |
|-----|--------|
| 0 | VS SCAN EVEN BL FOR STRING 1 |
| 1 | VS SCAN ODD BL FOR STRING 1 |

ADD=XX    VS_SCAN_BL_STR2

| [0] | OPTION |
|-----|--------|
| 0 | VS SCAN EVEN BL FOR STRING 2 |
| 1 | VS SCAN ODD BL FOR STRING 2 |

ADD=XX    VS_SCAN_BL_STR3

| [0] | OPTION |
|-----|--------|
| 0 | VS SCAN EVEN BL FOR STRING 3 |
| 1 | VS SCAN ODD BL FOR STRING 3 |

ADD=XX    VS_SCAN_BL_STR4

| [0] | OPTION |
|-----|--------|
| 0 | VS SCAN EVEN BL FOR STRING 4 |
| 1 | VS SCAN ODD BL FOR STRING 4 |

Figure 17

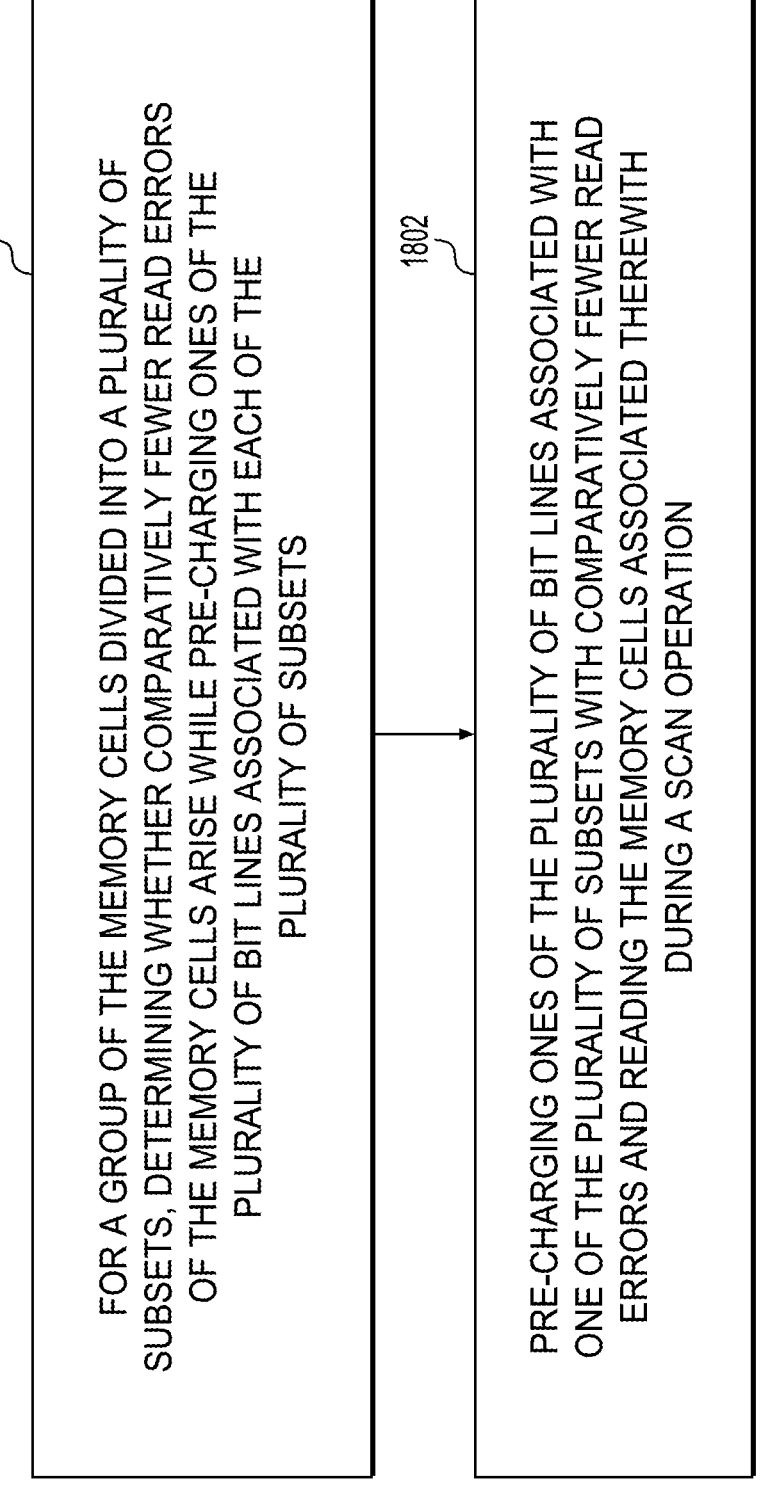

1800

FOR A GROUP OF THE MEMORY CELLS DIVIDED INTO A PLURALITY OF SUBSETS, DETERMINING WHETHER COMPARATIVELY FEWER READ ERRORS OF THE MEMORY CELLS ARISE WHILE PRE-CHARGING ONES OF THE PLURALITY OF BIT LINES ASSOCIATED WITH EACH OF THE PLURALITY OF SUBSETS

1802

PRE-CHARGING ONES OF THE PLURALITY OF BIT LINES ASSOCIATED WITH ONE OF THE PLURALITY OF SUBSETS WITH COMPARATIVELY FEWER READ ERRORS AND READING THE MEMORY CELLS ASSOCIATED THEREWITH DURING A SCAN OPERATION

Figure 18

VALLEY SEARCH SCAN BIT LINE SELECTION METHOD TO ADDRESS MEMORY HOLE AND STRING PROCESS VARIATION

CROSS-REFERENCE TO RELATED APPLICATIONS

This application claims the benefit of U.S. Provisional Application No. 63/432,101, filed on Dec. 13, 2022. The entire disclosure of the application referenced above is incorporated herein by reference.

FIELD

The present technology relates to the memory apparatuses and the operation of memory apparatuses.

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Some non-volatile storage elements or memory cells have charge storage regions for storing information. One example is a dielectric charge-trapping material that stores a charge which represents a data state. Another example is a conductive floating gate that stores a charge which represents a data state. The amount of charge may impact a threshold voltage of the non-volatile storage element, wherein one or more bits may be stored per non-volatile storage element. For example, each data state can be represented by a unique range in the threshold voltage. In one technique, there is a gap between each threshold voltage range.

In one possible process, a non-volatile storage element is programmed to a target threshold voltage that corresponds to its target data state. During programming, the threshold voltage is tested to verify that it is within the desired range (or at least above a verify target threshold voltage). However, some non-volatile storage elements may have a threshold voltage that is outside of their intended threshold voltage range. This could occur either immediately after programming, or over time the threshold voltage of the non-volatile storage element could drift.

Each of the data states has a read level associated with it. The read level is typically between adjacent threshold voltage ranges. However, due to threshold voltage drift, the ideal read level may need to be changed over time. This is sometimes referred to as determining a dynamic read level. Nonetheless, various challenges can arise in determining such dynamic read levels due to manufacturing process variations, for example. Accordingly, there is a need for improved non-volatile memory apparatuses and methods of operation.

SUMMARY

This section provides a general summary of the present disclosure and is not a comprehensive disclosure of its full scope or all of its features and advantages.

An object of the present disclosure is to provide a memory apparatus and a method of operating the memory apparatus that address and overcome the above-noted shortcomings.

Accordingly, it is an aspect of the present disclosure to provide a memory apparatus including memory cells connected to one of a plurality of word lines and disposed in memory holes each coupled to one of a plurality of bit lines. The memory cells are configured to retain a threshold voltage corresponding to one of a plurality of data states. A control means is coupled to the plurality of word lines and the plurality of bit lines and for a group of the memory cells divided into a plurality of subsets, is configured to determine whether comparatively fewer read errors of the memory cells arise while pre-charging ones of the plurality of bit lines associated with each of the plurality of subsets. The control means is also configured to pre-charge ones of the plurality of bit lines associated with one the plurality of subsets with comparatively fewer read errors and read the memory cells associated therewith during a scan operation.

According to another aspect of the disclosure, a controller in communication with a memory apparatus including memory cells connected to one of a plurality of word lines and disposed in memory holes each coupled to one of a plurality of bit lines is also provided. The memory cells are configured to retain a threshold voltage corresponding to one of a plurality of data states. For a group of the memory cells divided into a plurality of subsets, the controller is configured to instruct the memory apparatus to determine whether comparatively fewer read errors of the memory cells arise while pre-charging ones of the plurality of bit lines associated with each of the plurality of subsets. The controller is also configured to instruct the memory apparatus to pre-charge ones of the plurality of bit lines associated with one the plurality of subsets with comparatively fewer read errors and read the memory cells associated therewith during a scan operation.

According to an additional aspect of the disclosure, a method of operating a memory apparatus is provided. The memory apparatus includes memory cells connected to one of a plurality of word lines and disposed in memory holes each coupled to one of a plurality of bit lines. The memory cells are configured to retain a threshold voltage corresponding to one of a plurality of data states. The method includes the step of for a group of the memory cells divided into a plurality of subsets, determining whether comparatively fewer read errors of the memory cells arise while pre-charging ones of the plurality of bit lines associated with each of the plurality of subsets. The method also includes the step of pre-charging ones of the plurality of bit lines associated with one the plurality of subsets with comparatively fewer read errors and reading the memory cells associated therewith during a scan operation.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 5A illustrates example threshold voltage distributions corresponding to data states for the memory cell array when each memory cell stores three bits of data according to aspects of the disclosure;

FIG. 5B illustrates that threshold voltage distributions can partially overlap according to aspects of the disclosure;

FIG. 11 shows a chart illustrating additional details about the searching read according to aspects of the disclosure;

FIG. 17 shows examples of a plurality of valley scan bit line selection parameters according to aspects of the disclosure; and FIGS. 18 and 19 illustrates steps of a method of operating a memory apparatus according to aspects of the disclosure.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figures 1, 2:
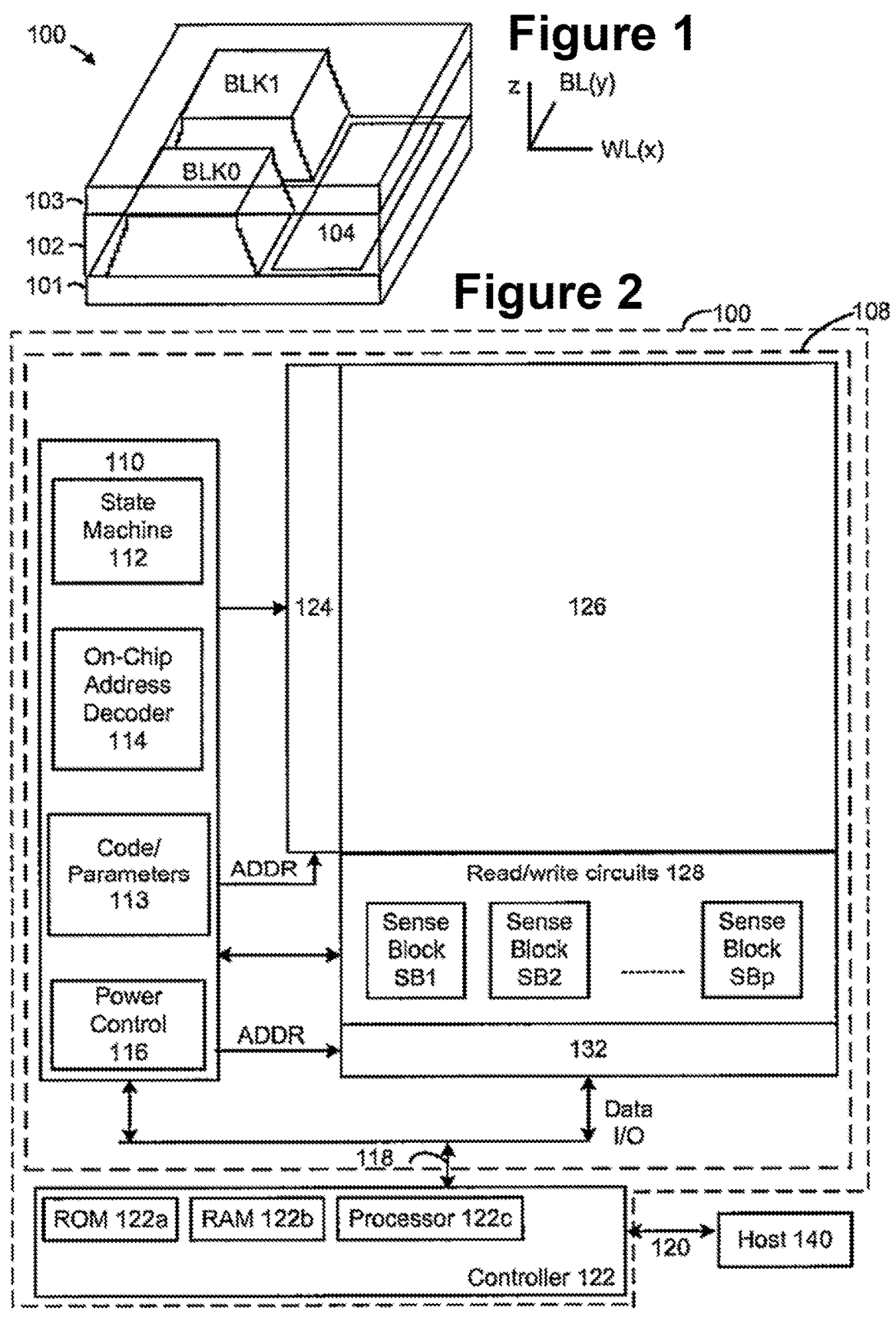
FIG. 1 is a perspective view of a 3D stacked non-volatile memory device according to aspects of the disclosure.
FIG. 2 is a functional block diagram of a memory device such as the 3D stacked non-volatile memory device of FIG. 1 according to aspects of the disclosure.

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of operation of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

In some memory devices or apparatuses, memory cells are joined to one another such as in NAND strings in a block or sub-block. Each NAND string comprises a number of memory cells connected in series between one or more drain-side select gate SG transistors (SGD transistors), on a drain-side of the NAND string which is connected to a bit line, and one or more source-side select gate SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells. The memory cells can include data memory cells, which are eligible to store user data, and dummy or non-data memory cells which are ineligible to store user data.

Before programming certain non-volatile memory devices, the memory cells are typically erased. For some devices, the erase operation removes electrons from the floating gate of the memory cell being erased. Alternatively, the erase operation removes electrons from the charge-trapping layer.

A programming operation for a set of memory cells typically involves applying a series of program voltages to the memory cells after the memory cells are provided in an erased state. Each program voltage is provided in a program loop, also referred to as a program-verify iteration. For example, the program voltage may be applied to a word line which is connected to control gates of the memory cells. In one approach, incremental step pulse programming is performed, where the program voltage is increased by a step size in each program loop. Verify operations may be performed after each program voltage to determine whether the memory cells have completed programming. When programming is completed for a memory cell, it can be locked out from further programming while programming continues for other memory cells in subsequent program loops.

Each memory cell may be associated with a data state according to write data in a program command. Based on its data state, a memory cell will either remain in the erased state or be programmed to a data state (a programmed data state) different from the erased state. For example, in a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states (see FIGS. 5A and 5B). In a four-bit per cell memory device, there are sixteen data states including the erased state and fifteen higher data states referred to as the Er, 1, 2, 3, 4, 5, 6, 7, 8, 9, A, B, C, D, E and F data states.

When a program command is issued, the write data is stored in latches associated with the memory cells. During programming, the latches of a memory cell can be read to determine the data state to which the cell is to be programmed. Each programmed data state is associated with a verify voltage such that a memory cell with a given data state is considered to have completed programming when a sensing operation determines its threshold voltage (Vth) is above the associated verify voltage. A sensing operation can determine whether a memory cell has a Vth above the associated verify voltage by applying the associated verify voltage to the control gate and sensing a current through the memory cell. If the current is relatively high, this indicates the memory cell is in a conductive state, such that the Vth is less than the control gate voltage. If the current is relatively low, this indicates the memory cell is in a non-conductive state, such that the Vth is above the control gate voltage.

Due to data retention issues, the threshold voltage (Vt) of non-volatile storage elements may shift. Therefore, the read level (CGRV) should be changed/updated to reflect the Vt shift. One technique for finding a new read level is to perform a valley search. A valley search refers to a valley between two adjacent threshold voltage distributions. The valley search may include performing multiple reads to find the valley between two adjacent threshold voltage distributions. A new read level may be based on the location of the valley. In one possible technique, the valley search includes determining a count of how many non-volatile storage elements have a threshold voltage within a threshold voltage window that is defined by two read levels. This may be repeated for several threshold voltage windows, such that several counts are determined. The process of determining the count may be referred to herein as a "scan." During such scans, specific bit lines may be pre-charged and read to reduce coupling noise from neighboring bit lines. However, the specific bit lines that are pre-charged and read may not be the most ideal due to variations of the vertical strings (i.e., memory holes) or rows of the memory holes.

FIG. 1 is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

FIG. 2 is a functional block diagram of an example memory device such as the 3D stacked non-volatile memory device 100 of FIG. 1. Memory device 100 includes one or more memory die 108. Each memory die 108 includes a three dimensional memory structure 126 of memory cells (such as, for example, a 3D array of memory cells), control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. In some systems, a controller 122 is included in the same memory device 100 (e.g., a removable storage card) as the one or more memory die 108. However, in other systems, the controller can be separated from the memory die 108. In some embodiments, one controller 122 will communicate with multiple memory die 108. In other embodiments, each memory die 108 has its own controller. Commands and data are transferred between the host 140 and controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Code and parameter storage 113 may be provided for storing operational parameters and software. In one embodiment, state machine 112 is programmable by the software stored in code and parameter storage 113. In other embodiments, state machine 112 does not use software and is completely implemented in hardware (e.g., electronic circuits).

The on-chip address decoder 114 provides an address interface between addresses used by host 140 or memory controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, storage 113, power control module 116, sense blocks SB1, SB2, . . . , SBp, read/write circuits 128, and controller 122 can be considered a managing circuit that performs the functions described herein.

The (on-chip or off-chip) controller 122 may comprise a processor 122 c and storage devices (memory) such as ROM 122 a and RAM 122 b. The storage devices comprises code such as a set of instructions, and the processor 122 c is operable to execute the set of instructions to provide the functionality described herein. Alternatively or additionally, processor 122 c can access code from a storage device in the memory structure, such as a reserved area of memory cells connected to one or more word lines.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that this technology is not limited to a single specific memory structure, but covers many relevant memory structures within the spirit and scope of the technology as described herein and as understood by one of ordinary skill in the art.

Figure 3:
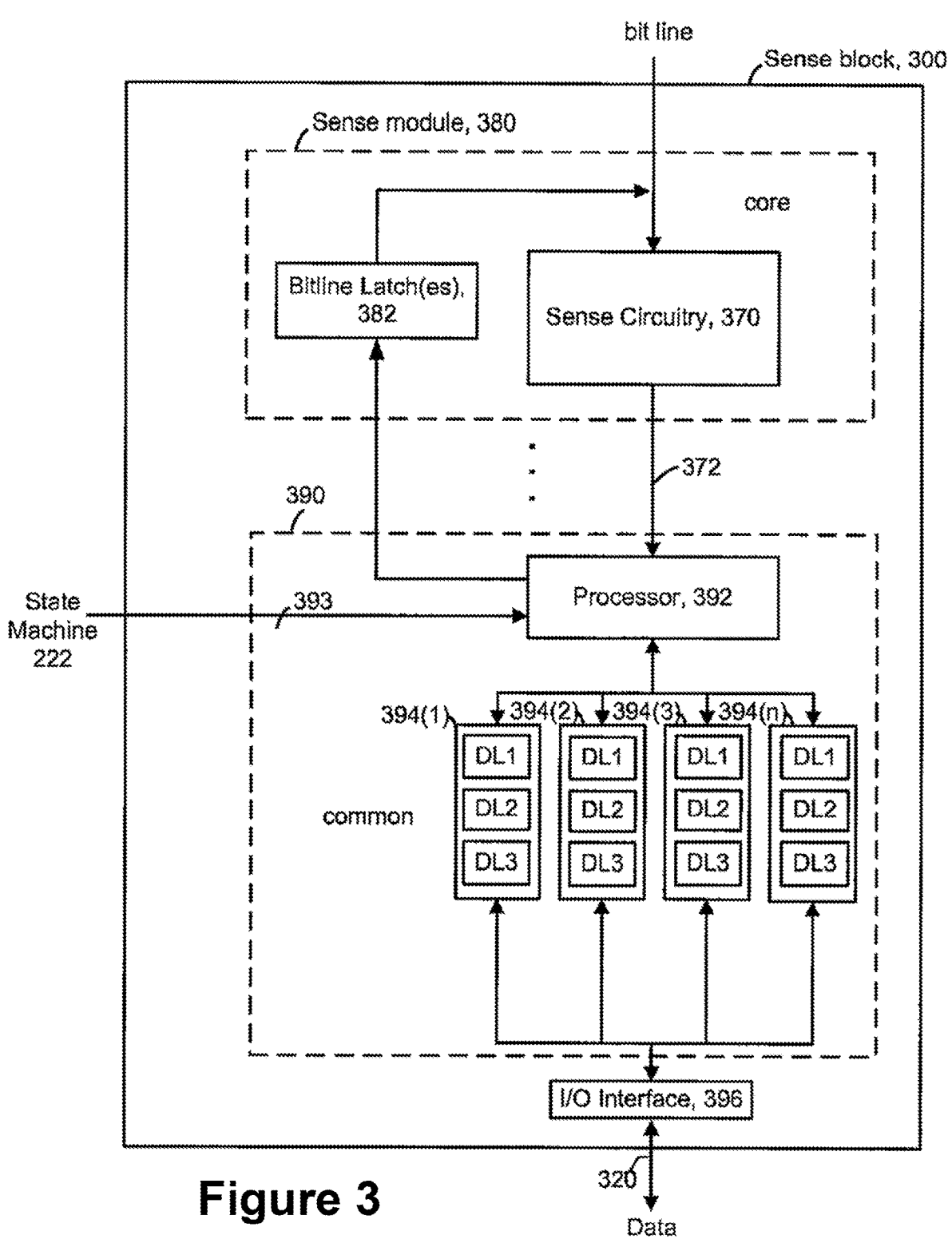
FIG. 3 is a block diagram of an individual sense block according to aspects of the disclosure.

FIG. 3 is a block diagram of an individual sense block 300 partitioned into a core portion, referred to as a sense module 380, and a common portion 390. In one embodiment, there will be a separate sense module 380 for each bit line and one common portion 390 for a set of multiple sense modules 380. In one example, a sense block will include one common portion 390 and eight sense modules 380. Each of the sense modules in a group will communicate with the associated common portion via a data bus 372.

Sense module 380 comprises sense circuitry 370 that determines whether a conduction current in a connected bit line is above or below a predetermined threshold level. In some embodiments, sense module 380 includes a circuit commonly referred to as a sense amplifier. Sense module 380 also includes a bit line latch 382 that is used to set a voltage condition on the connected bit line. For example, a predetermined state latched in bit line latch 382 will result in the connected bit line being pulled to a state designating program inhibit (e.g., Vdd).

Common portion 390 comprises a processor 392, three example sets of data latches 394-397, and an I/O Interface 396 coupled between the sets of data latches 394(1)-394(n) and data bus 320. One set of data latches 394 can be provided for each sense module, and three data latches identified by DL1, DL2, and DL3 may be provided for each set. The use of the data latches is further discussed below. Processor 392 performs computations. For example, one of its functions is to determine the data stored in the sensed memory cell and store the determined data in the set of data latches. A set of data latches 394 may be used to store data bits determined by processor 392 during a read operation. In some embodiments, two data latches in a set of the data latches (e.g., DL1 and DL2 in set 394(1)) are used to store first and second read results, as a part of a process that dynamically determines read levels. Data latches 394 may also be used to store data bits imported from the data bus 320 during a program operation. The imported data bits represent write data meant to be programmed into the memory. I/O interface 396 provides an interface between data latches 394 and the data bus 320. Note that in one embodiment, data latches 394 are implemented within the sense module 380. Thus, in one embodiment, there is a DL1, DL2, and a DL3 latch in each sense module 380.

During read or sensing, the operation of the system is under the control of state machine 112 that controls the supply of different control gate voltages to the addressed cell. As it steps through the various predefined control gate voltages corresponding to the various memory states supported by the memory, the sense module 380 may trip at one of these voltages and an output will be provided from sense module 380 to processor 392 via bus 372. At that point, processor 392 determines the resultant memory state by consideration of the tripping event(s) of the sense module and the information about the applied control gate voltage from the state machine 112 via input lines 393. It then computes a binary encoding for the memory state and stores the resultant data bits into data latches 394. In another embodiment of the core portion, bit line latch 382 serves double duty, both as a latch for latching the output of the sense module 380 and also as a bit line latch as described above. Note that just as latches 394 can include a DL1, DL2, and DL3 latch, the bit line latch(es) 382 can include several bit line latches.

It is anticipated that some implementations will include multiple processors 392. In one embodiment, each processor 392 will include an output line (not depicted in FIG. 3) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 392 to accumulate the results of the associated bit lines such that the state machine need only read the wired-OR line one time.

During program or verify, the data to be programmed is stored in the set of data latches 394 from the data bus 320. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 392 monitors the verified memory state relative to the desired memory state. When the two are in agreement, processor 392 sets the bit line latch 382 so as to cause the bit line to be pulled to a state designating program inhibit. This inhibits the cell coupled to the bit line from further programming even if it is subjected to programming pulses on its control gate. In other embodiments the processor initially loads the bit line latch 382 and the sense circuitry sets it to an inhibit value during the verify process.

Each set of data latch stacks 394(1)-139($n$) contains a stack of data latches corresponding to one sense module 380, in one embodiment. In one embodiment, there are 3-5 (or another number) data latches per sense module 380. In one embodiment, the latches are each one bit. In some implementations (but not required), the data latches are implemented as a shift register so that the parallel data stored therein is converted to serial data for data bus 320, and vice versa. In one embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 4A:
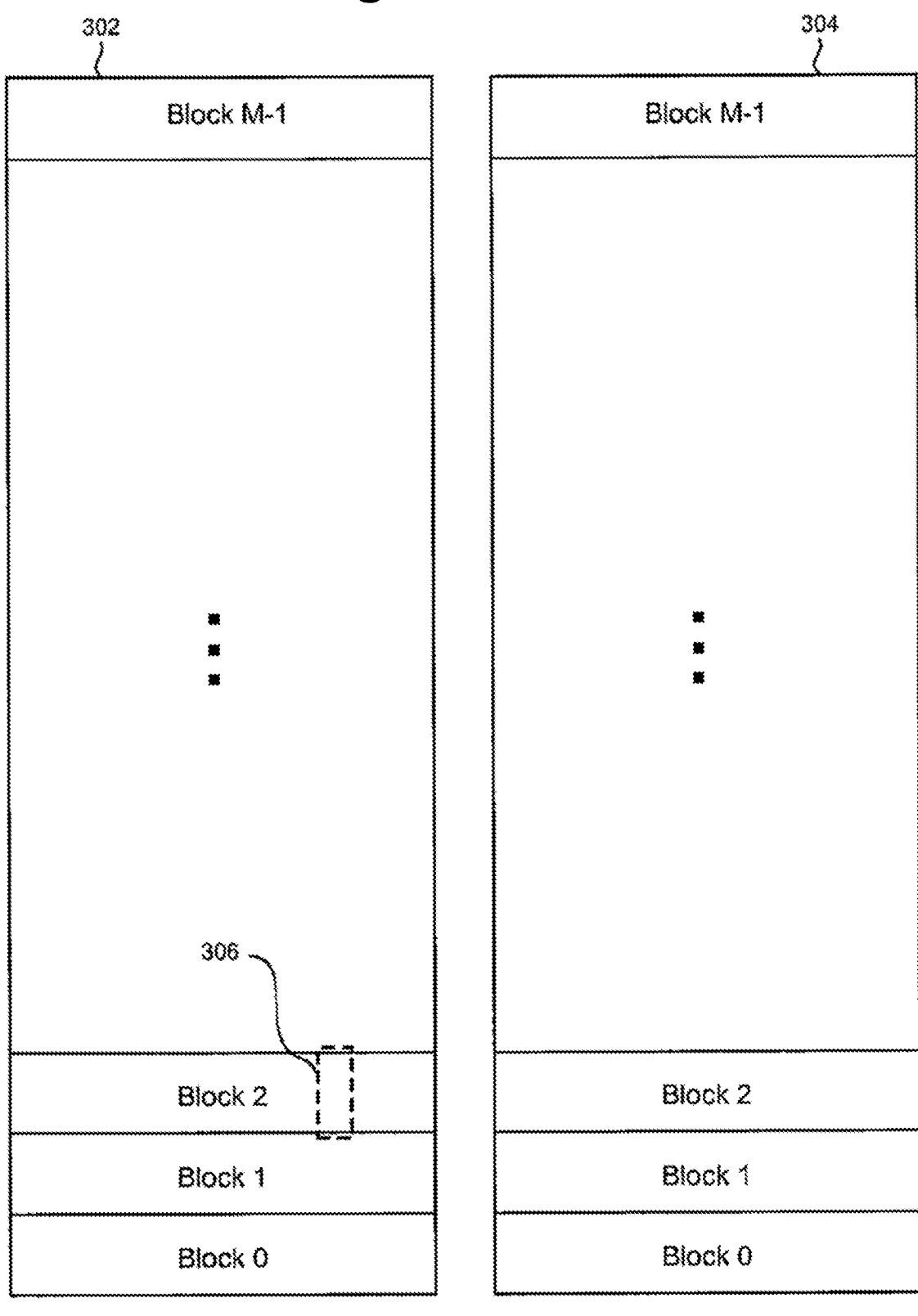
FIG. 4A is a block diagram of a memory structure having two planes according to aspects of the disclosure.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used.

Figure 4B:
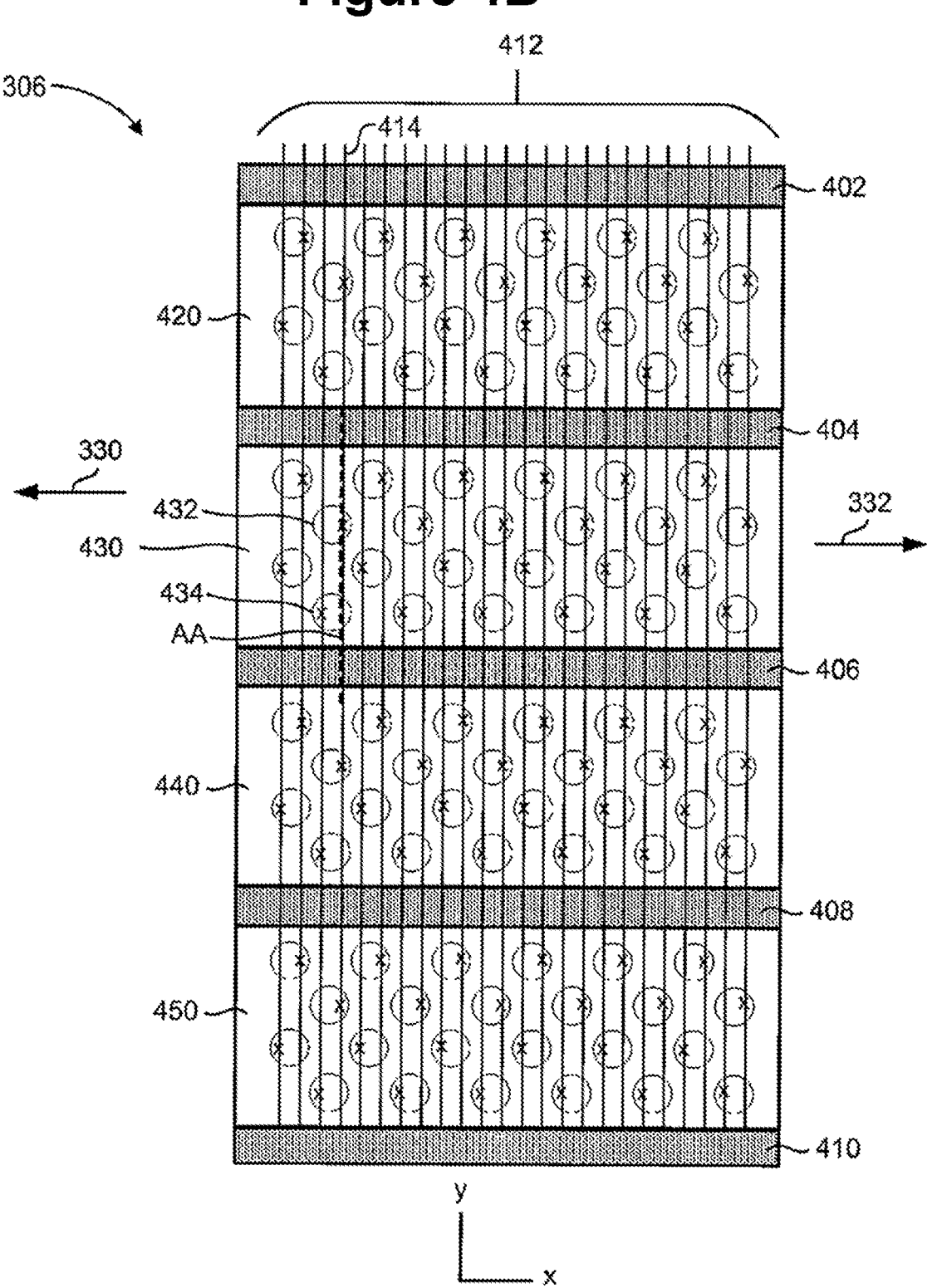
FIG. 4B depicts a top view of a portion of a block of memory cells according to aspects of the disclosure.

FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of arrow 330 and in the direction of arrow 332. In one embodiment, the memory array will have 48 layers. Other embodiments have less than or more than 48 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. More details of the vertical columns are provided below. Since the block depicted in FIG. 4B extends in the direction of arrow 330 and in the direction of arrow 332, the block includes more vertical columns than depicted in FIG. 4B.

FIG. 4B also depicts a set of bit lines 412. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the managing circuit uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
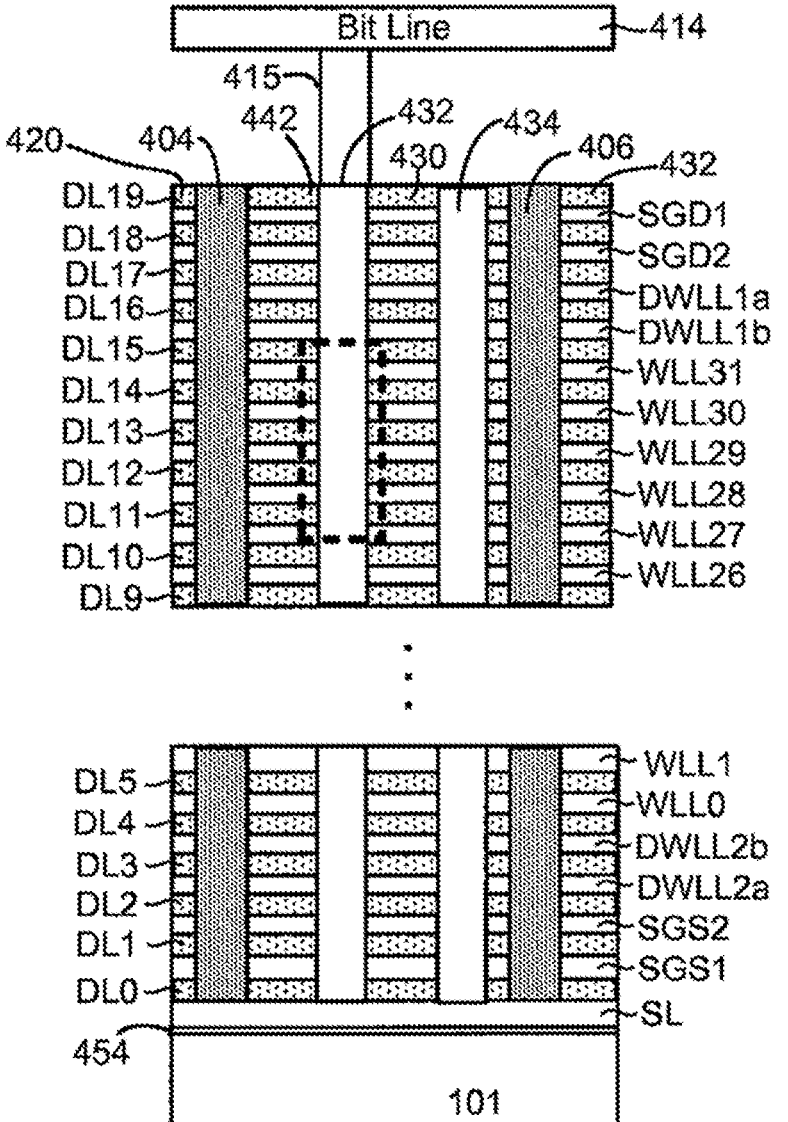
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes two drain side select layers SGD1 and SGD1; two source side select layers SGS1 and SGS2; four dummy word line layers DWLL1 a, DWLL1 b, DWLL2 a and DWLL2 b; and thirty two word line layers WLL0-WLL31 for connecting to data memory cells. Other embodiments can implement more or less than two drain side select layers, more or less than two source side select layers, more or less than four dummy word line layers, and more or less than thirty two word line layers. Vertical columns 432 and 434 are depicted protruding through the drain side select layers, source side select layers, dummy word line layers and word line layers. In one embodiment, each vertical column comprises a NAND string. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD1 and SGD1; source side select layers SGS1 and SGS2; dummy word line layers DWLL1 a, DWLL1 b, DWLL2 a and DWLL2 b; and word line layers WLL0-WLL31 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL19. For example, dielectric layers DL10 is above word line layer WLL26 and below word line layer WLL27. In one embodiment, the dielectric layers are made from SiO2. In other embodiments, other dielectric materials can be used to form the dielectric layers.

The memory cells are formed along vertical columns which extend through alternating conductive and dielectric layers in the stack. In one embodiment, the memory cells are arranged in NAND strings. The word line layer WLL0-WLL31 connect to memory cells (also called data memory cells). Dummy word line layers DWLL1 a, DWLL1 b, DWLL2 a and DWLL2 b connect to dummy memory cells. A dummy memory cell, also referred to as a non-data memory cell, does not store user data, while a data memory cell is eligible to store user data. Thus, data memory cells may be programmed Drain side select layers SGD1 and SGD1 are used to electrically connect and disconnect NAND strings from bit lines. Source side select layers SGS1 and SGS2 are used to electrically connect and disconnect NAND strings from the source line SL.

Figure 4D:
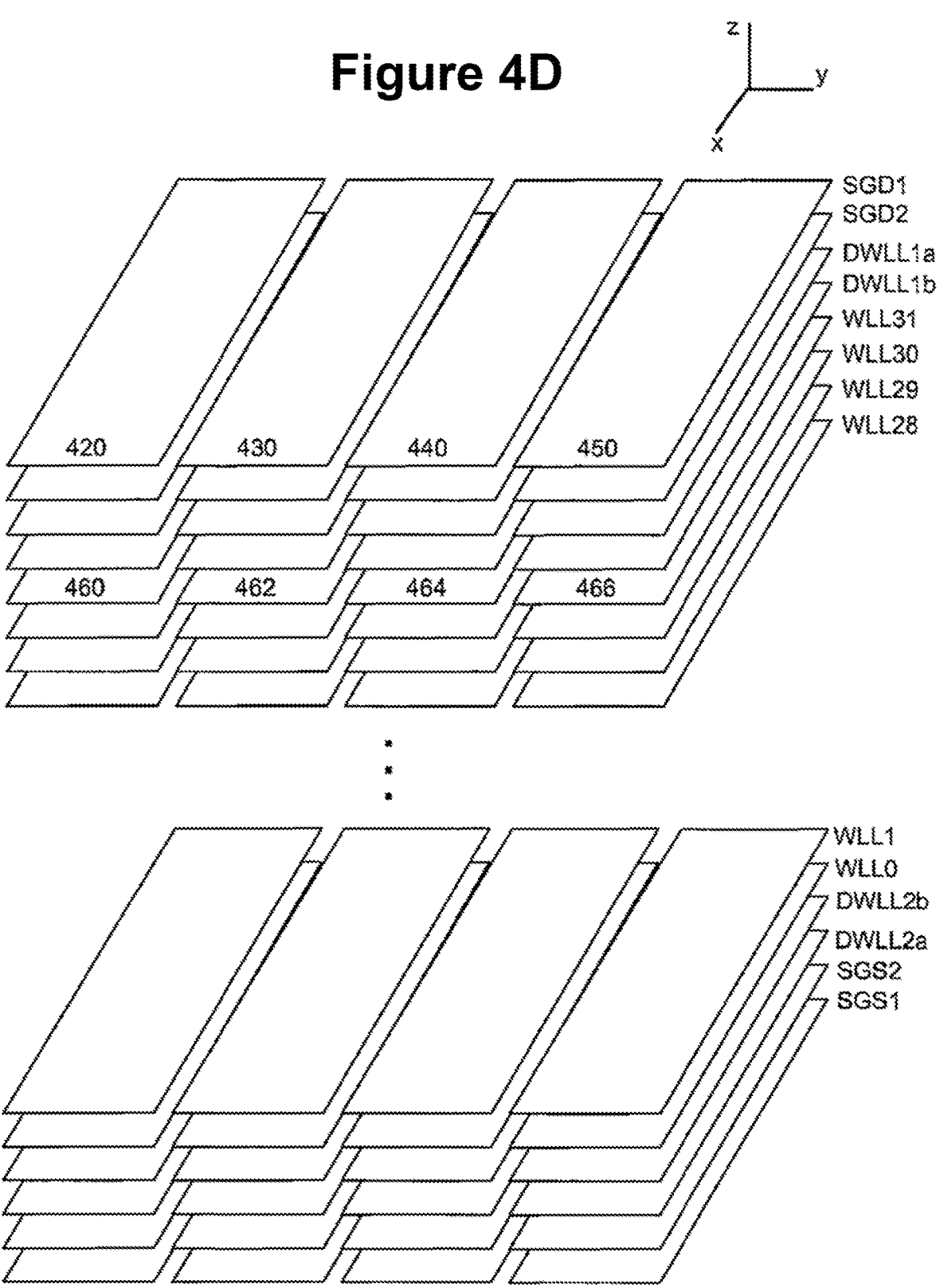
FIG. 4D depicts a view of the select gate layers and word line layers.

FIG. 4D depicts a perspective view of the conductive layers (SGD1, SGD1, SGS1, SGS2; DWLL1 a, DWLL1 b, DWLL2 a, DWLL2 b, and WLL0-WLL31) for the block that is partially depicted in FIG. 4C. As mentioned above with respect to FIG. 4B, local interconnects 401, 404, 406, 408 and 410 break up each conductive layers into four regions. For example, drain side select gate layer SGD1 (the top layer) is divided into regions 420, 430, 440 and 450. Similarly, word line layer WLL31 is divided into regions 460, 462, 464 and 466. For word line layers (WLL0-WLL-31), the regions are referred to as word line fingers; for example, word line layer WLL31 is divided into word line fingers 460, 462, 464 and 466.

Figure 4E:
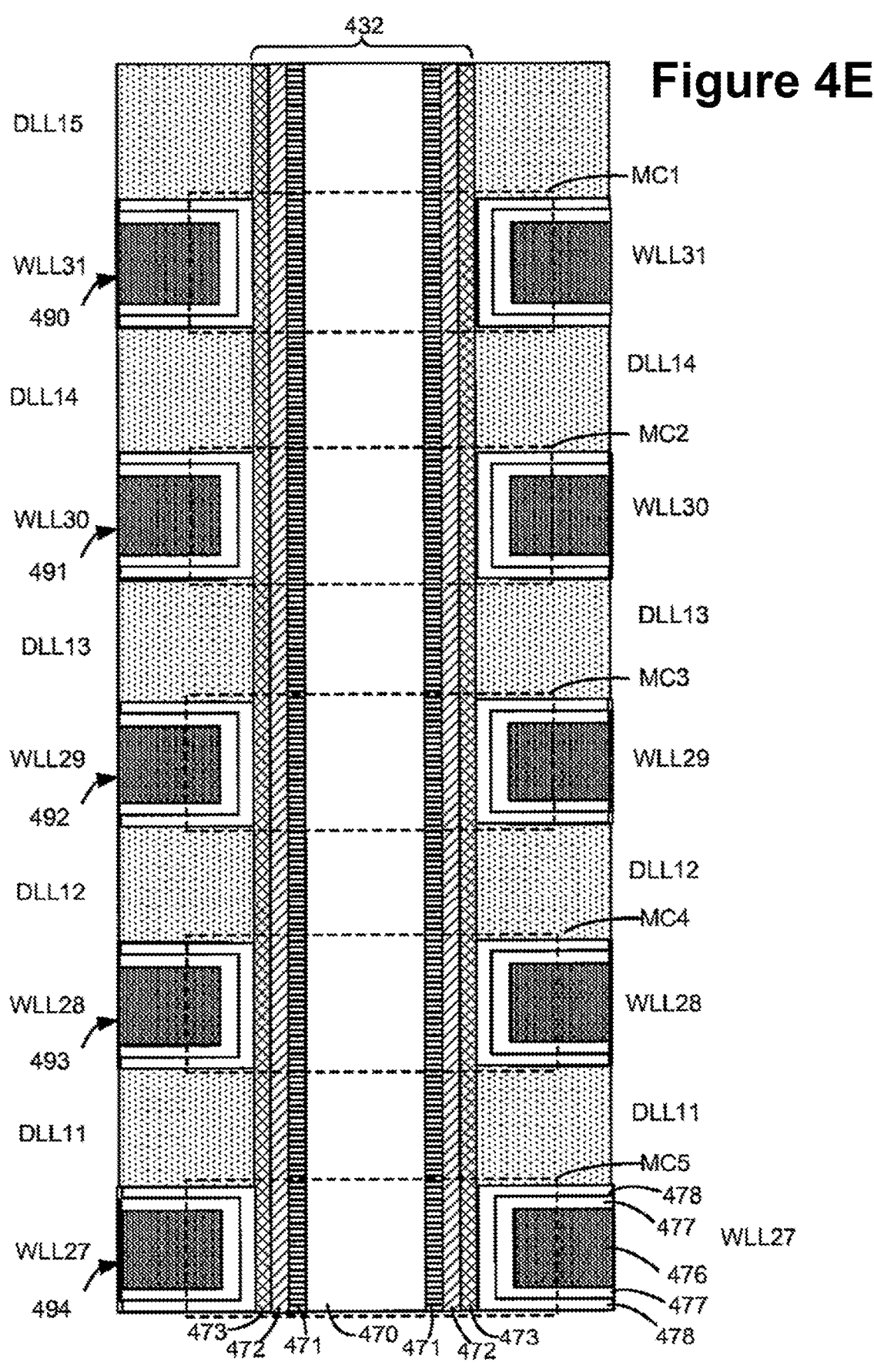
FIG. 4E is a cross sectional view of a vertical column of memory cells according to aspects of the disclosure.

FIG. 4E depicts a cross sectional view of region 442 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as Sift. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) a specially formulated silicon nitride that increases trap density.

FIG. 4E depicts dielectric layers DLL11, DLL12, DLL13, DLL14 and DLL15, as well as word line layers WLL27, WLL28, WLL29, WLL30, and WLL31. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell comprises channel 471, tunneling dielectric 472, charge trapping layer 473, blocking oxide layer 478, aluminum oxide layer 477 and word line region 476. For example, word line layer WLL31 and a portion of vertical column 432 comprise a memory cell MC1. Word line layer WLL30 and a portion of vertical column 432 comprise a memory cell MC2. Word line layer WLL29 and a portion of vertical column 432 comprise a memory cell MC3. Word line layer WLL28 and a portion of vertical column 432 comprise a memory cell MC4. Word line layer WLL27 and a portion of vertical column 432 comprise a memory cell MC5.

When a memory cell is programmed, electrons are stored in a portion of the charge trapping layer 473 which is associated with the memory cell. These electrons are drawn into the charge trapping layer 473 from the channel 471, through the tunneling layer 473, in response to an appropriate voltage on word line region 476. The threshold voltage (Vth) of a memory cell is increased in proportion to the amount of stored charge. During an erase operation, the electrons return to the channel.

Due to data retention issues, the Vt of the memory cells may shift. Therefore, the read compare level (CGRV) should be changed/updated to reflect the Vt shift. A dynamic read valley search may be performed by the managing circuit (e.g., at the direction of the state machine), and comprises multiple reads to find the valley between adjacent threshold voltage distributions to identify where the new CGRV should be.

At the end of a successful programming process (with verification), the threshold voltages of the memory cells should be within one or more distributions of threshold voltages for programmed memory cells or within a distribution of threshold voltages for erased memory cells, as appropriate. FIG. 5A illustrates example Vt distributions corresponding to data states for the memory cell array when each memory cell stores three bits of data. Other embodiment, however, may use more or fewer than three bits of data per memory cell. One axis represents the number of memory cells. This may be a logarithmic scale. The other axis represents threshold voltage (Vt) of the memory cells.

FIG. 5A shows eight Vt distributions corresponding to an Erase state and programmed states A-G. In one embodiment, the threshold voltages in the Erase state are negative and the threshold voltages in the programmed states A-G are positive. However, the threshold voltages in one or more of programmed states A-G may be negative. Some or all of the threshold voltages in the Erase state could be positive.

At or near the lower edge of the threshold distribution for each programmed state is a verify reference voltage. For example, FIG. 5A shows VvA for the A-state, VvB for the B-state, VvC for the C-state, VvD for the D-state, VvE for the E-state, VvF for the F-state, and VvG for the G-state. When programming memory cells to a given state, the managing circuit will test whether those memory cells have a threshold voltage greater than or equal to the verify reference voltage.

Between each adjacent pair of the Vt distributions are read reference voltages used for reading data from memory cells. For example, FIG. 5A shows read reference voltage VrA between the erase state and the A-state, VrB between the A-state and B-state, VrC between the B-state and C-state, VrD between the C-state and D-state, VrE between the D-state and E-state, VrF between the E-state and F-state, and VrG between the F-state and G-state. By testing whether the threshold voltage of a given memory cell is above or below the respective read reference voltages, the managing circuit can determine what state the memory cell is in. For example, a memory cell whose threshold voltage is greater than VrD, but less them VrE may be assumed to be in the D-state.

FIG. 5B illustrates that Vt distributions can partially overlap. For example, with respect to read level VrB, some A-state memory cells have a threshold voltage that is greater than VrB. Also, some B-state memory cells have a threshold voltage that is less than VrB. Some amount of overlap is acceptable as an error correction algorithm can handle a certain percentage of cells whose Vt is outside of their intended Vt range.

Note that in some embodiments, just after programming, the threshold voltage distribution may resemble FIG. 5A. However, over time, the threshold voltages of memory cells may shift, such that there may be overlap between Vt distributions. One possible cause of the shift is charge leaking from the charge storage region of memory cells. Another possible cause of the shift is charge unintentionally being added to the charge storage region of memory cells.

On the other hand, in some cases, there may be overlap between Vt distributions immediately after programming. For example, some memory cells may be over-programmed. An example of this is when programming a memory cell to the A-state its threshold voltage may unintentionally go above VrB. It is also possible for under-programming to occur. An example of this is that when programming a memory cell to the B-state its threshold voltage may not quite reach the VrB level. In each case, this does not mean the programming has failed. As noted above, an error correction algorithm can handle a certain percentage of cells whose threshold voltage is not in their intended Vt distribution.

Also note that contrary to the equal spacing/width of the depicted threshold voltage distributions, various distributions may have different widths/spacings in order to accommodate varying amounts of susceptibility to data retention loss, as well as other factors.

Figure 6:
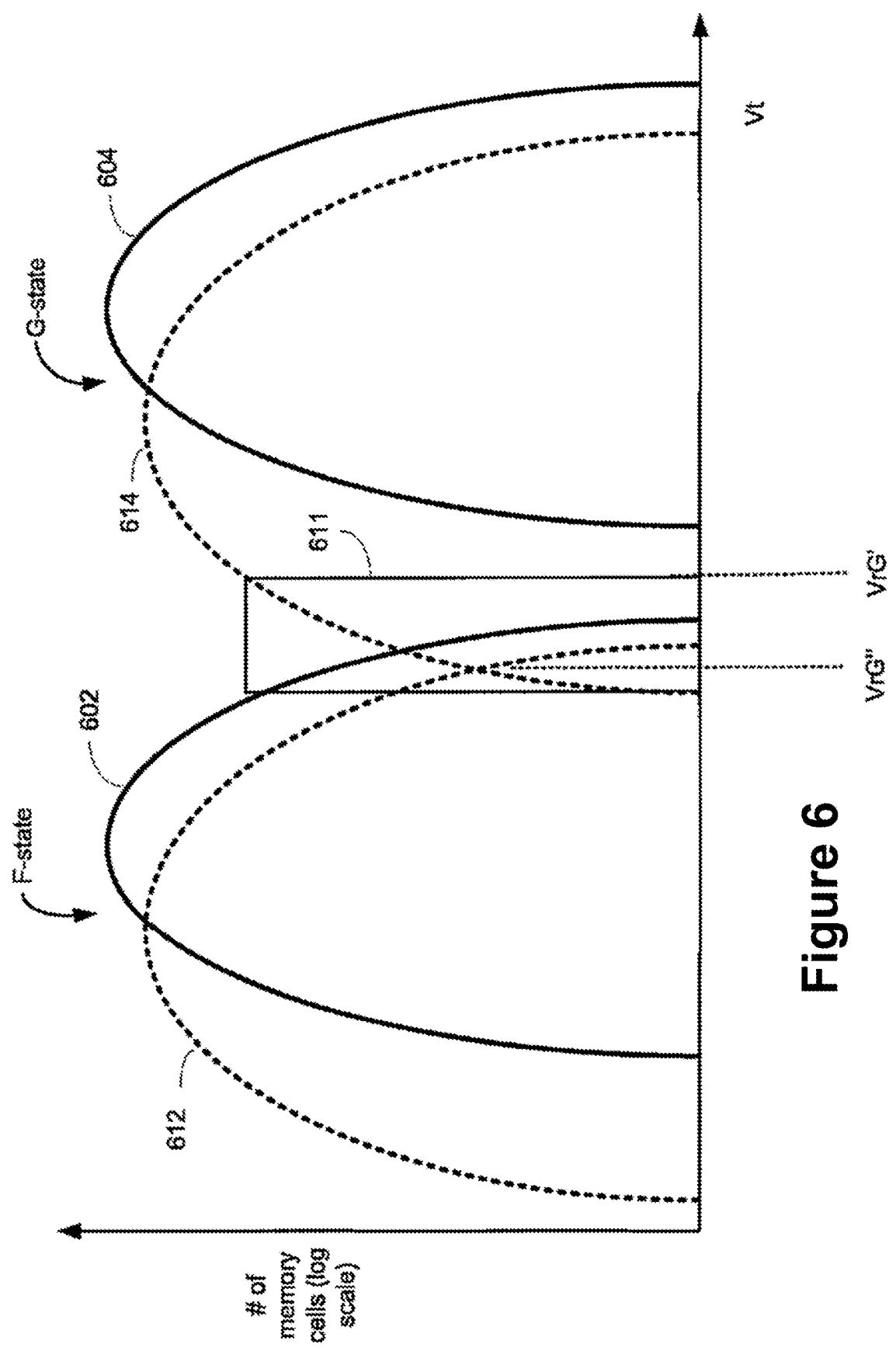
FIG. 6 shows threshold voltage distributions for two of the data states from FIG. 5B according to aspects of the disclosure.

FIG. 6 shows threshold voltage distributions for two of the data states from FIG. 5B (F-state and G-state), each for two points in time. Curves 602 and 604 show Vt distributions corresponding to just after the memory cells were programmed Curves 612 and 614 show Vt distributions corresponding to some time after the memory cells were programmed Just after programming, there is a significant gap between the F-state and G-state. However, after some time, the threshold voltages may shift for a number of reasons. One possible reason is that the memory device may have rested without use for a period of time, resulting in charge loss from the memory cells, referred to as data retention loss. If the memory device was in a hot environment, such as an automobile, data retention may be a greater problem.

Curve 614 shows a possible shift for the threshold distribution of the G-state. In this example, the threshold voltages have in general shifted downward, due to charge loss from the memory cell. Also, there has been some spreading of the range of the threshold voltages, due to cell-to-cell variation in the amount of threshold shift down. Curve 612 shows a possible shift for the threshold distribution of the F-state. Similar to the G-state, the threshold voltages for the F-state have in general shifted downward. Also, there has been some spreading of the range of the threshold voltages. Note that other shifts in the threshold voltages are possible.

Voltage level VrG' represents a read level that may be suitable for use just after programming Voltage level VrG" represents a read level that may be suitable for use after the threshold voltage distributions have shifted to curves 612 and 614. In this example, read point VrG" corresponds to the valley of curves 612 and 614 (where the curves first intersect), although a different read level might be used.

Note that if read level VrG' were to be used after the threshold voltage distributions have shifted to curves 612 and 614, then memory cells on curve 614 with threshold voltages below VrG' would be misread. In general, box 611 represents memory cells with threshold voltages on curve 714 that would be misread if read level VrG' were to be used. Using VrG' would not result in misreads of memory cells with threshold voltages on curve 612. However, as can be seen there are a substantial number of memory cells on curve 614. Note that the y-axis may be on a log scale.

Error correction algorithms are able to handle some misreads. However, if the number of misreads is too high then the data cannot be successfully read. For example, if the number of misreads is greater than the error correction ability of one embodiment of controller 122, then the data cannot be accurately read. Also, the error correction algorithm can take a considerable amount of time to converge if there are too many misreads. Hence, the time to complete the read operation can be increased substantially, even if it is eventually successful.

However, by dynamically adjusting the read level to, for example, VrG", the data can be successfully read in at least some cases in which it would not be successfully read when using VrG'. Also, even if the data could have been successfully read when using VrG', the read process may be faster when reading at VrG" due to the error correction algorithm taking less time to converge.

Note that there still may be a small number of misreads when reading at VrG; however, error correction should be able to correct these misreads. In this example, a misread occurs for memory cells on curve 614 with a threshold voltage lower than VrG". A misread occurs for memory cells on curve 612 with a threshold voltage higher than VrG". Note that due to the log scale, there may be relatively few memory cells at the intersection of curves 612 and 614.

In one embodiment, the read level is dynamically adjusted to minimize misreads. However, it is not required that misreads be minimized. In one embodiment, the read level is dynamically adjusted such that misreads are sufficiently low such that they may be corrected using ECC. In some cases, a relatively strong ECC may be available, in which case a higher number of misreads may be tolerable.

Note that there may be variations from one memory die to the next, which may lead to differences in threshold voltage distributions. Also, within a memory die there may be variations. For example, there could be differences from one block to the next. Also, there may be word line to word line variations within a block. One possible reason for these differences is that various interference effects may be different depending on the die, block, word line, etc. This may lead to differences in threshold distribution widths. Also, there may be differences in history of the data written to different blocks. For example, two blocks programmed at two different times, which have been resting for different periods of time, will show different amount of threshold shift. Therefore, in general, the optimum read levels may differ based on die, block, word line, etc.

Read levels may be dynamically determined for any unit (die, block, word line, word line layer, level in 3D array, etc.). Note that even for memory arrays that are freshly programmed, there may be differences between dies, blocks, word lines, etc., which may lead to differences between the threshold distributions. In other words, it may not be the case that one set of read levels are suitable for all dies, blocks, word lines, etc. Therefore, dynamically determining read levels may be used for freshly programmed memory. This may allow for optimizing read levels for dies, blocks, word lines, etc.

Figure 7A:
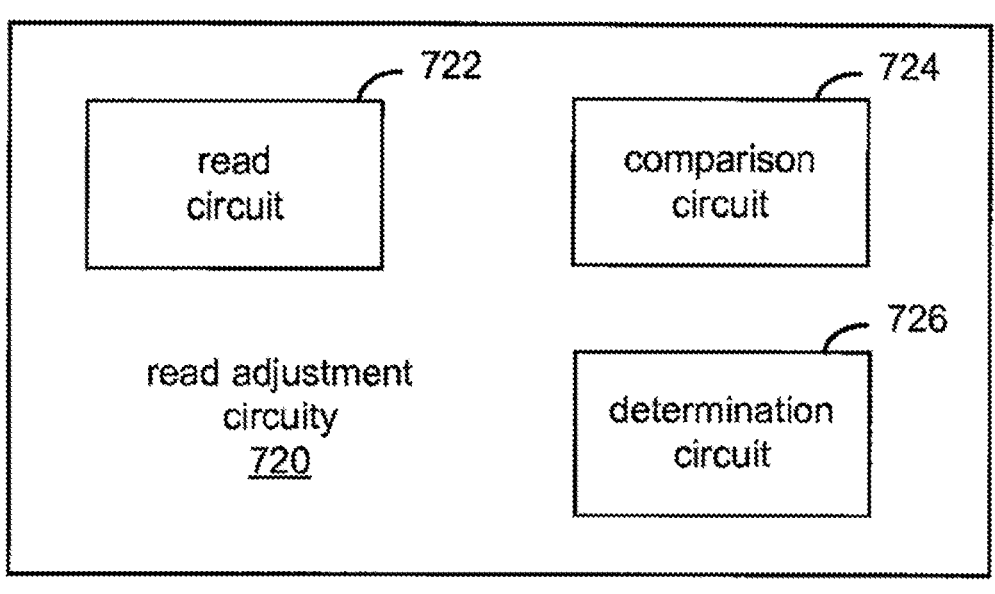
FIG. 7A depicts a block diagram of one embodiment of read adjustment circuitry according to aspects of the disclosure.

FIG. 7A depicts a block diagram of one embodiment of read adjustment circuitry 720. The read adjustment circuitry 720 is configured to determine an adjusted read level, which may also be referred to as a dynamic read level. The read adjustment circuitry 720 includes a read circuit 722, a comparison circuit 724, and a determination circuit 726. The read adjustment circuitry 720 may be implemented with a managing circuit described herein.

The read circuit 722 is configured to sense threshold voltages of memory cells, in one embodiment. The read circuit 722 is able to read non-volatile storage elements at a set of reference levels. To do so, the read circuit 722 may apply reference voltages to control gates of the memory cells. This may also be referred to as applying reference voltages to a word line associated with the memory cells. The read circuit 722 could include any portion of managing circuit described with respect to FIG. 1. For example, the read circuit 722 may be part of read/write circuit (FIG. 1, 128). However, the read circuit 722 is not limited to being part of read/write circuit 128. The read circuit 722 may include a sense block (e.g., FIG. 3, 300). The read circuit 722 could be implemented in part via state machine 112. The read circuit 722 could be implemented in part via on-chip address decoder 114. The read circuit 722 could be implemented in part via code/parameters 113. The read circuit 722 could be implemented in part via processor 122 *c*. The read circuit 722 could be implemented in part via controller 122.

The comparison circuit 724 is configured to compare results of reading a memory cell at two different reference levels, in one embodiment. The comparison circuit 724 is configured to make this comparison while the read circuit 722 reads the memory cell at a different reference level. The comparison circuit 724 could include any portion of managing circuit described with respect to FIG. 1. The comparison circuit 724 may be implemented by one or more of controller 122, processor 122 *c*, ROM 122 *a*, RAM 122 *b*, state machine 112, and/or code/parameters 113, but is not limited thereto.

The determination circuit 726 is configured to determine an adjusted read level based on a comparison of results of reading a group of memory cells at two different reference levels. The determination circuit 726 could include any portion of managing circuit described with respect to FIG. 1. The determination circuit 726 may be implemented by one or more of controller 122, processor 122 *c*, ROM 122 *a*, RAM 122 *b*, state machine 112, and/or code/parameters 113, but is not limited thereto.

Figure 7B:
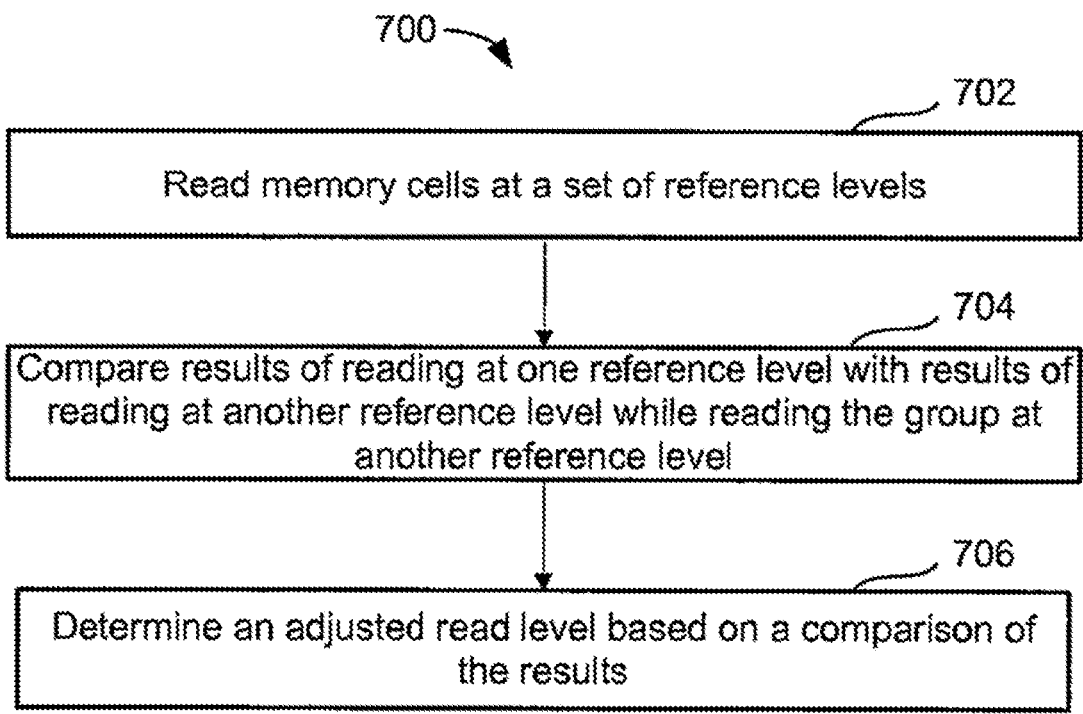
FIG. 7B is a flowchart of one embodiment of a process of determining a dynamic read level according to aspects of the disclosure.
Figure 7C:
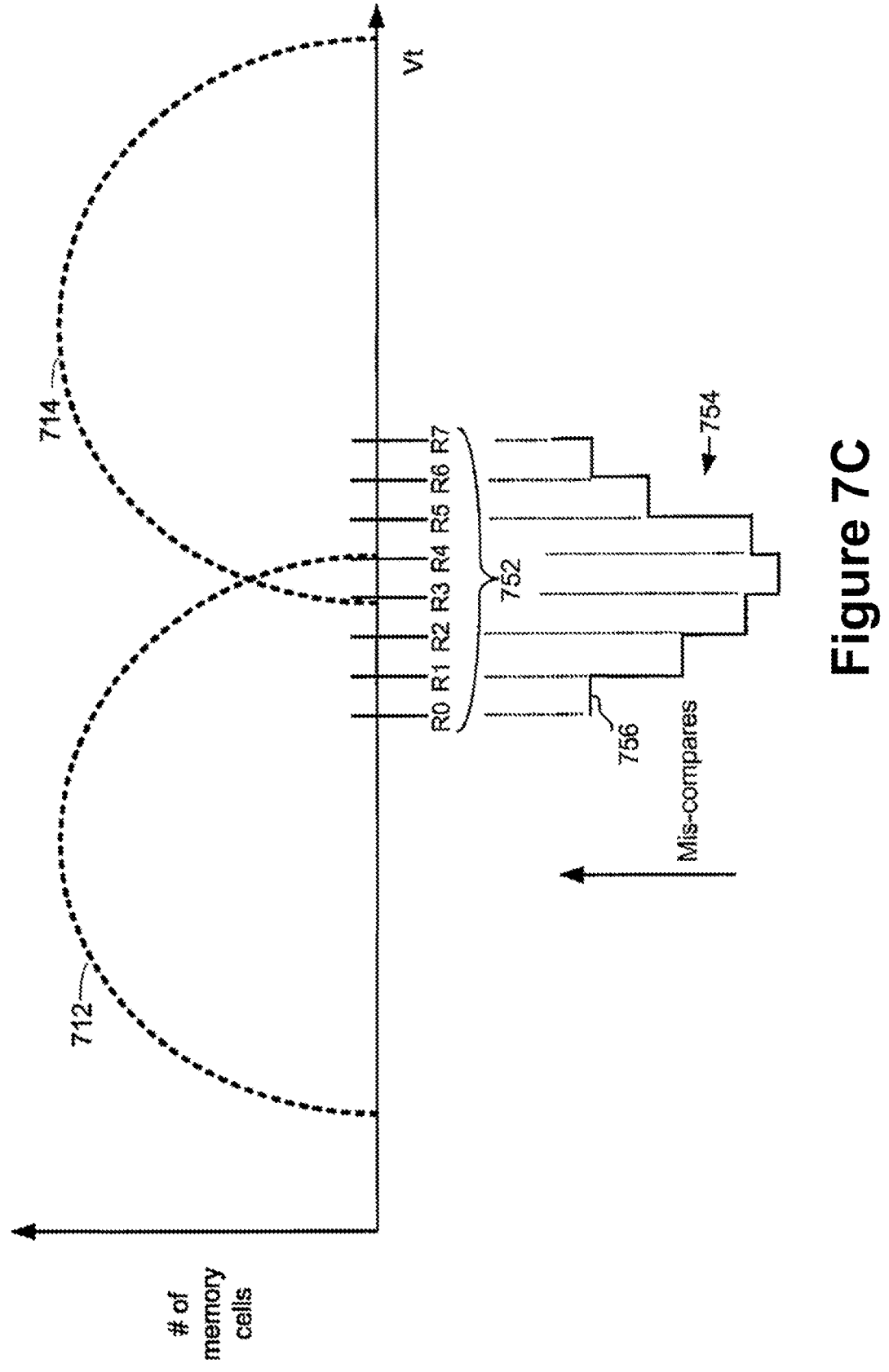
FIG. 7C depicts one example of a set of reference levels that may be used in the process of FIG. 7B according to aspects of the disclosure.

FIG. 7B is a flowchart of one embodiment of a process 700 of determining a dynamic read level. This could be a read level such as VrA, VrB, VrC, VrD, VrE, VrF, or VrG in FIG. 5A. Note that process 700 can be performed one time for each read level. In one embodiment, read adjustment circuitry 720 performs this process. Note that steps in the process are not necessarily performed in the depicted order. Also, some of the steps may take place concurrently with another step. The process will be discussed in connection with FIG. 7C, which is a diagram illustrating a set of read levels for a valley search. Briefly, FIG. 7C depicts two example Vt distributions 712, 714, and a set of reference levels 752. The set 752 contains reference levels R0-R7.

In one embodiment, process 700 scans for a valley between the two Vt distributions 712, 714. Note that when reading a memory cell at a given reference level, the result indicates the Vt of the memory cell relative to the reference level. Thus, reading at two reference levels provides information to determine whether the Vt of the memory cell is between the two reference levels. Thus, reading at two reference levels is able to determine how many memory cells have a Vt in the window between the two reference levels. The valley refers to a Vt window containing the fewest memory cells, in one embodiment.

In step 702, a group of memory cells are read at a set of reference levels. In one embodiment, the group of memory cells are associated with the same word line. However, not every memory cells associated with the word line needs to be in the group. In one embodiment, the group includes every other memory cell along the word line. For example, memory cells associated with odd bit lines are in the group or, alternatively, memory cells associated with even bit lines are in the group. In one embodiment, bit lines associated with memory cells not being read are grounded. This can help to speed the reading of the other memory cells. In effect, the grounded bit lines may provide shielding, which reduces or eliminates capacitive coupling between bit lines.

FIG. 7C depicts one example of a set of reference levels 752. Note that step 702 may refer to reading at any of the reference levels. Thus, the "set" being referred to in step 702 could be a subset of the set of reference levels 752. In one embodiment, reading occurs at progressively higher reference levels. For example, reading could start with reference level in the set 752 that is associated with the lowest Vt (e.g., R0) and then continue sequentially through the set to progressively higher reference levels. In one embodiment, reading occurs at progressively lower reference levels. For example reading could start with the reference level in the set 752 that is associated with the highest Vt (e.g., R7) and then continue sequentially through the set to progressively lower reference levels. Note that the gaps between reference levels in FIG. 7C is relatively small compared to the size of gaps between read reference levels (e.g., VrA, VrB) in FIG. 5A. Also note that some of the reference levels in the set 752 could be skipped in step 702. In one embodiment, one or more reference levels in the middle of set 752 are skipped. In one embodiment, the process starts at one end of the set (e.g., R0) and terminates early by not reading any at the other end (e.g., R5, R6, R7). In this case, those that are not read are referred to as being beyond the set being referred to in step 702.

Figure 7D:
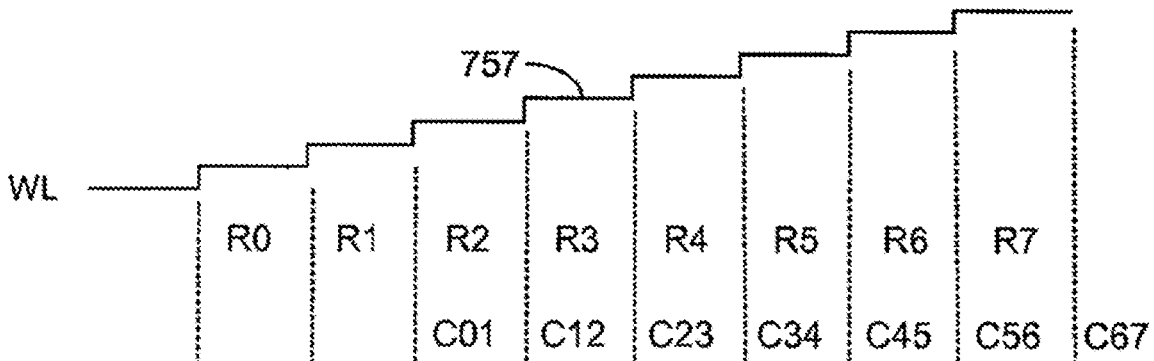
FIG. 7D shows example word line voltages that may be applied to control gates of the memory cells during step 702 of the process of FIG. 7B according to aspects of the disclosure.

FIG. 7D shows example word line voltages 757 that may be applied to control gates of the memory cells during step 702. The nine different levels correspond to an initial word line level that does not correspond to any reference level in the set and the eight example reference levels (R0-R7) in the set of reference levels 752. Note that the word line voltage 757 is not brought back down to the initial level between the reads, which speeds the process. In one embodiment, the set of reference levels is an ordered set. Herein, the term "ordered set" of reference levels (or the like) refers to a set of reference levels in which one each element follows another in a sequence. FIG. 7D shows one example of an ordered set of reference levels that get progressively higher. Another alternative is to start with the highest magnitude voltage and progressively get smaller. A set of set of reference levels in which the magnitude of the reference levels increases from one reference level to the next is an example of monotonically increasing. A set of set of reference levels in which the magnitude decreases from one reference level to the next is an example of monotonically decreasing. A set of reference levels that changes monotonically may either increase monotonically or decrease monotonically. A sequence of monotonically increasing voltage levels herein refers to a sequence in which the magnitude of the voltage level increases from one voltage level to the next. A sequence of monotonically decreasing voltage levels herein refers to a sequence in which the magnitude of the voltage level decreases from one voltage level to the next. A sequence of monotonically changing voltage levels is one that is either monotonically increasing or monotonically decreasing.

In step 704, results of reading at one reference level are compared with results of reading at another reference level. Step 704 occurs while reading at another reference level in the set. FIG. 7D will be used to illustrate. As one example, the read circuit 722 reads the memory cells at reference level R0, then at reference level R1. The read circuit 722 may store the results of these reads in data latches. Next, the read circuit 722 may read the memory cells at reference level R2. While the read circuit 722 is reading the memory cells at reference level R2, the comparison circuit 724 may compare the results of reading the memory cells at reference level R0 to the results of reading the memory cells at reference level R1.

Referring again to FIG. 7C, one technique for performing the comparison is to detect what are referred to herein as "mis-compares." Mis-compares may be determined on a memory cell by memory cell basis. Recall that the result of reading a memory cell at a given reference level reflects its Vt relative to the reference level. For example, a "0" may indicate that its Vt is at or below the reference level, and a "1" may indicate that its Vt is above the reference level. A mis-compare indicates that the memory cell result was different at the two reference levels. For example, the memory cell had a "0" at one reference level and a "1" at the other reference level. This indicates that the memory cell's Vt is between the two reference levels. FIG. 7C depicts a mis-compare count 754. The mis-compare count 754 has seven different levels (one of the levels 756 is labeled). Mis-compare level 756 refers to a comparison of reads at reference levels R0 and R1. Other mis-compare levels refer to comparisons between other read levels.

FIG. 7D further illustrates the timing of the comparison, in one embodiment. The comparison of the reads at reference level R0 and R1 is referred to as "C01". Note that this comparison may include determining a mis-compare count. Note that this comparison may occur during the read at reference level R2. Similarly, the comparison of the reads at reference level R1 and R2 is referred to as "C12." Note that this comparison may occur during the read at reference level R3. Note that the example in FIG. 7D is simplified for the sake of explanation. A given comparison does not necessarily start and end with a read. For example, the comparison of results of reference level R0 and R1 does not necessarily begin when the read at reference level R2 begins. Also, the comparison of results of reference level R0 and R1 does not necessarily end when the read at reference level R2 ends. The comparison of results of reference level R0 and R1 could end before or after the read at reference level R2 ends. Also note that in this example, reading occurs in all reference levels in the set. However, as will be discussed below, in some embodiments, reading may be skipped at one or more of the reference levels.

Also note that a read at one level can overlap with a read at another level. A read can be considered to include establishing conditions for the read (e.g., word line voltage), sensing a condition of the memory cell, and storing the result of the sensing. It is possible for some of the activities of reading at one reference level to overlap with an activity of reading at another level. For example, results of reading at one level might be stored after beginning to establish conditions for reading at the next level. Thus, the read at a given level can extend past the time that the word line voltage begins to change to the reference level for the next read. In other words, the word line voltage can be changed before the read is completed.

In some embodiments, the time to determine the mis-compare count takes less time to complete than the read. For example, the time to determine the mis-compare count may take about 3 microseconds, and the read about 5 microseconds. This is one factor that allows the comparisons to be hidden in the reads. Also note that techniques are disclosed herein for speeding up the comparison, such that it can be completed in less time than a read.

Step 706 includes determining an adjusted read level based on the comparisons of the results. The adjusted read level may also be referred to as a dynamic read level. Referring again to FIG. 7C, note that the mis-compares have a pattern in which there is a minimum that corresponds to the comparison of reads at levels R3 and R4. This corresponds to the valley, in one embodiment. The dynamic read level may be set based on the valley. For example, the dynamic read level could be set to reference level R3, reference level R4, or some value between R3 and R4.

In one embodiment, determination circuit 726 performs step 706. In one embodiment, the determination circuit 726 searches for a minimum of the mis-compare count. In one embodiment, the determination circuit 726 searches until the mis-compare count is at or below a target threshold. Another criterion could be used. Note that it is not required that the mis-compare count actually total all of the mis-compares. For example, the circuitry that counts mis-compares could simply stop counting when the mis-compare count exceeds some threshold. This can save some time in counting mis-compares, as well as simplify circuitry used to perform the count.

Figure 8:
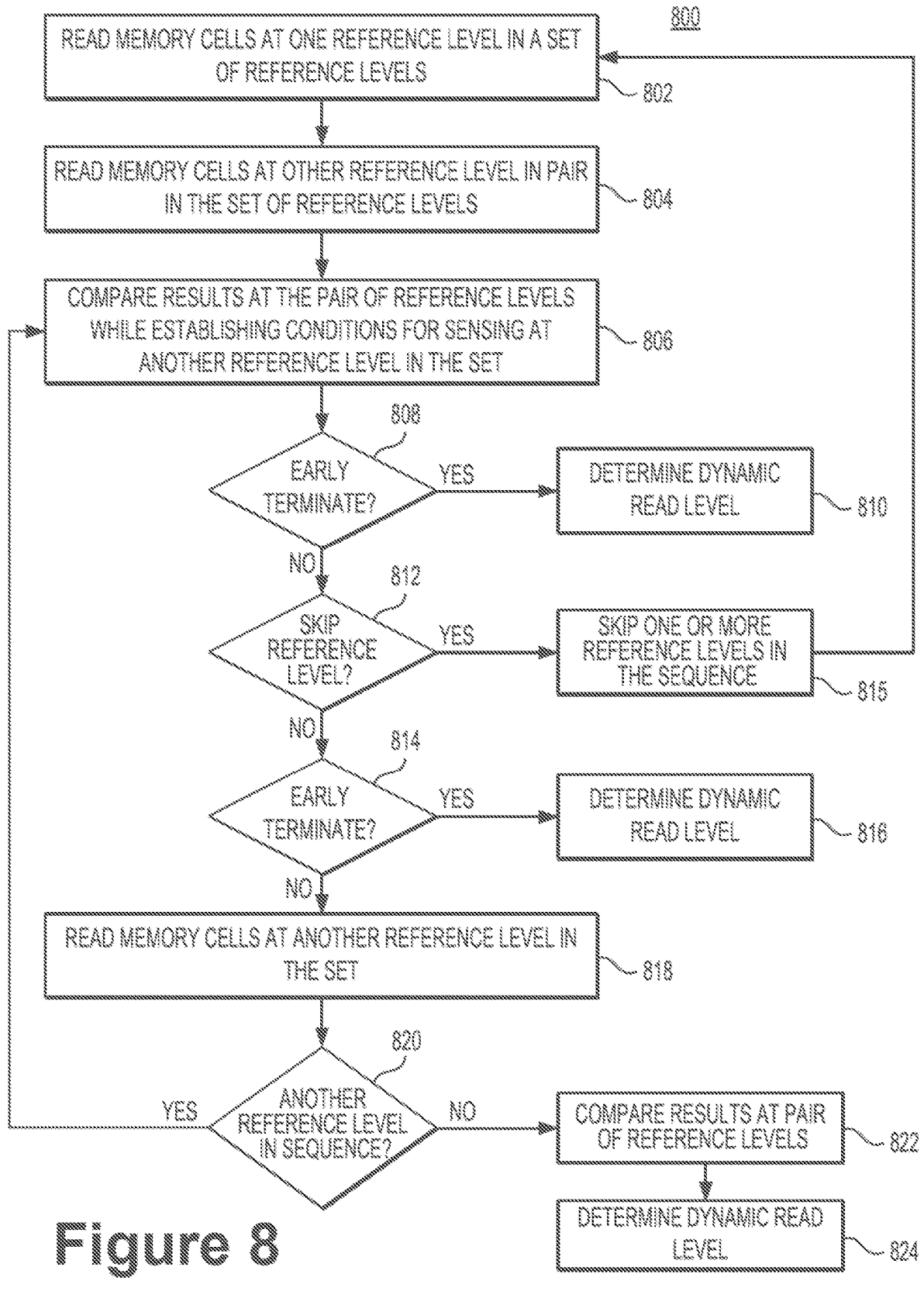
FIG. 8 is a flowchart of one embodiment of a process of determining a dynamic read level according to aspects of the disclosure.

FIG. 8 is a flowchart of one embodiment of a process 800 of determining a dynamic read level. Process 800 is one embodiment of process 700. As noted in the discussion of process 700, it is not required that the read be completed at all reference levels in the set. Process 800 describes techniques for early termination of the process, as well as techniques for skipping one or more reference levels in the set.

In step 802, memory cells are read at a one reference level in a set of reference levels. For example, the memory cells may be read at reference level R0. As another alternative, the memory cells may be read at reference level R7. In one embodiment, the set contains an ordered set of reference levels. The reference levels may progressively increase from one reference level to the next in the ordered set or progressively decrease from one reference level to the next in the ordered set. For example, in FIG. 7D, the reference levels progressively increase from one reference level to the next.

In step 804, the memory cells are read at another reference level in the set of reference levels. For example, the memory cells may be read at reference level R1. As another alternative, the memory cells may be read at reference level R6. In one embodiment, this is the next reference level in the ordered set of reference levels. The reference levels in steps 802 and 804 are referred to as a pair of reference levels. In one embodiment, these two reference levels are next to each other in an ordered set of reference levels. In one embodiment, ordered set of reference levels is ordered with progressively increasing or, alternatively, progressively decreasing voltage magnitudes.

In step 806, results of reading at the two previous reference levels are compared while establishing conditions for sensing at another reference level in the set. In one embodiment, the other reference level is the next reference level in the ordered set. Stated one way one reference level immediately follows the other in the set. For example, referring to FIG. 7D, while comparing results of reading at reference level R0 with results of reading at reference level R1, conditions for sensing at reference level R2 are established. In one embodiment, step 806 determines a mis-compare count. This may be referred to as performing a scan.

In one embodiment, establishing conditions for sensing at another reference level in the set includes establishing a voltage level on control gates of the memory cells. In one embodiment, the read circuit 722 changes a voltage applied to a word line that is coupled to control gates of the memory cells from one reference level of the pair to the other reference level of the pair without bringing the word line voltage down to ground between the reads at the reference levels in the pair.

In one embodiment, establishing conditions for sensing at another reference level in the set includes establishing a voltage level on sense nodes associated with the memory cells. For example, there may be a sense amplifier associated with each memory cell. The sense amplifier may have a sense node, which may be charged to a sense voltage as a condition for sensing the memory cell.

In step 808, a determination is made whether to terminate process 800. The process may be terminated early in response to a determination that the valley has been found. Early termination alleviates the need to read at all of the potential reference levels in the set, which saves time. One example of determining that the valley has been found is that the number of mis-compares is below a low threshold. This low threshold is an indication that the number of memory cells having a Vt between the two reference levels is sufficiently low such that the valley has been found, or at least that it is unlikely that a lower number of mis-compares will be found, in one embodiment. In one embodiment, step 808 is made by determination circuit 726.

On the other hand, if the determination in step 808 is not early termination, then the process continues at step 812. In step 812, a determination is made whether to skip a reference level in the set. As one example, if the search is presently far away from the valley, then one or more reference levels in the set may be skipped. For example, if in step 806, conditions were being established to sense at reference level R2, the reading at reference level R2 may be skipped. This determination may be made by comparing the mis-compare count is at or above an upper threshold that indicates that the valley is not close.

In the event that a reference level is not to be skipped, then the process continues at step 814. Step 814 is a second test for early termination. Step 814 involves a count of mis-compares for this pair of reference levels and a count of mis-compares for the previous pair of reference levels. A condition for early termination is that the count of mis-compares the present pair of reference levels is greater than or equal to the count of mis-compares for the previous pair of reference level plus a small delta (e.g., threshold amount). This test looks for the case when the mis-compare count is going back up. The delta is used to prevent a local valley from causing early termination. Note that in step 814, the count of mis-compares for the present pair should be less than the upper threshold. Also, the count of mis-compares for the present pair may be greater than the lower threshold.

If the determination in step 814 is early termination, then the process continues at step 816. In step 816, a dynamic read level is determined. This may be based on the comparison(s) performed in step 806. In this case, determination circuit 726 may determine a dynamic read level based on the values of the reference levels in the previous comparison.

In the event that a reference level is to be skipped (step 812 is yes), process 800 goes to step 815. This step may include determining the next reference level to apply to the control gates of the memory cells. This step may also include establishing new conditions for sensing the memory cells. Recall that in step 806 conditions were established for sensing the memory cells. This may include establishing a suitable control gate (or word line) voltage. In step 815, a new voltage may be established on the word line. For example, referring to FIG. 7D, the voltage associated with reference level R3 may have been established on the word line in step 815. In step 815, the word line voltage can be increased to the voltage associated with reference level R4, as one example. In this example, one reference level in the set is skipped. However, more than one reference level may be skipped. After step 815, the process may continue at step 802, which in this case is to sense the memory cells based on the conditions that were established in step 815. When step 804 is performed, sensing may occur at, reference level R5, as one example. Then, in step 806 the results of sensing at reference levels R4 and R5 may be compared, while establishing conditions for sensing at reference level R6, as one example. Note that the voltage gaps between the reference levels in the set may be uniform, although this is not a requirement. The technique just described keeps the voltage gaps between the reference levels that are compared in step 806 uniform from one iteration of step 806 to the next.

Discussion will now return to the case that goes down the path to step 814. If it is determined to not terminate early in step 814, then the process goes to step 818. In step 818, the memory cells are read at another reference level in the set. The memory cells are read at the next reference level in an ordered set, in one embodiment. In one embodiment, step 818 includes reading the memory cells at the reference level for which the conditions were established in step 806. For example, referring to FIG. 7D, in step 806 conditions were established for reading at reference level R2. This was performed while comparing the results of sensing at reference levels R0 and R1. In step 818, reading may be performed at reference level R2. This reading may include storing results of reading. This is just one example for step 818.

After step 818, a determination is made (in step 820) whether there are any other reference levels for which reading should occur. For example, if the reading of step 818 was of the reference level R7, then there are no more reference levels for which sensing should occur.

Assuming there are more reference levels to sense at, process 800 goes back to step 806. Recall that in step 806 a comparison was made of the results of reading at a pair of reference levels while establishing conditions for sensing at another reference level. As one example, the last iteration of step 818 sensed at reference level R2. In this case, the pair of reference levels whose results are compared may be reference levels R1 and R2. While performing this comparison, conditions may be established for sensing at reference level R3. The process then continues at step 808.

Discussion will now return to the case in which the determination in step 820 was that there are no more reference levels in the set to read. In this case, the process goes to step 822. In step 822, the results at a pair of reference levels are compared. However, since there are no more reference levels to read, there is no need to establish conditions for sensing at another reference level. This, this step differs from step 806.

In step 824 a dynamic read level is determined. This may be based on one or more of the comparisons. There are numerous ways to make this determination. One example, is to select the comparison that had the minimum number of mis-compares and base the dynamic read level from the reference levels associated with that comparison.

Note that in process 800, the total number of reads can vary. In a best case scenario, the process 800 might only take two reads. In a worst case scenario, the process might read at every reference level in the set. Assume that there are eight reads in the set of reference levels. In one embodiment of process 800, the worst case would take two eight reads plus one scan (the comparison in step 822 is not hidden in a read). If we assume five microseconds for a read, and three microseconds for a scan, this is just 43 microseconds. In one embodiment of process 800, the best case would take two reads plus one scan. This is just 13 microseconds with the foregoing assumptions. If the average takes four reads, then this results in four reads plus one scan, which is just 23 microseconds. Thus, process 800 is able to rapidly determine a dynamic read level. These times are for the sake of illustration. The read time may be impacted by the bit line settling time. The bit line settling time can be improved, in some embodiments, by selecting fewer memory cells along the word line to test. For example, instead of testing every other memory cell, every fourth memory cell might be tested. Note that the scan time might also be faster when testing a smaller set of memory cells. Hence, the scan may still be able to be hidden within the shorter read.

Figure 9:
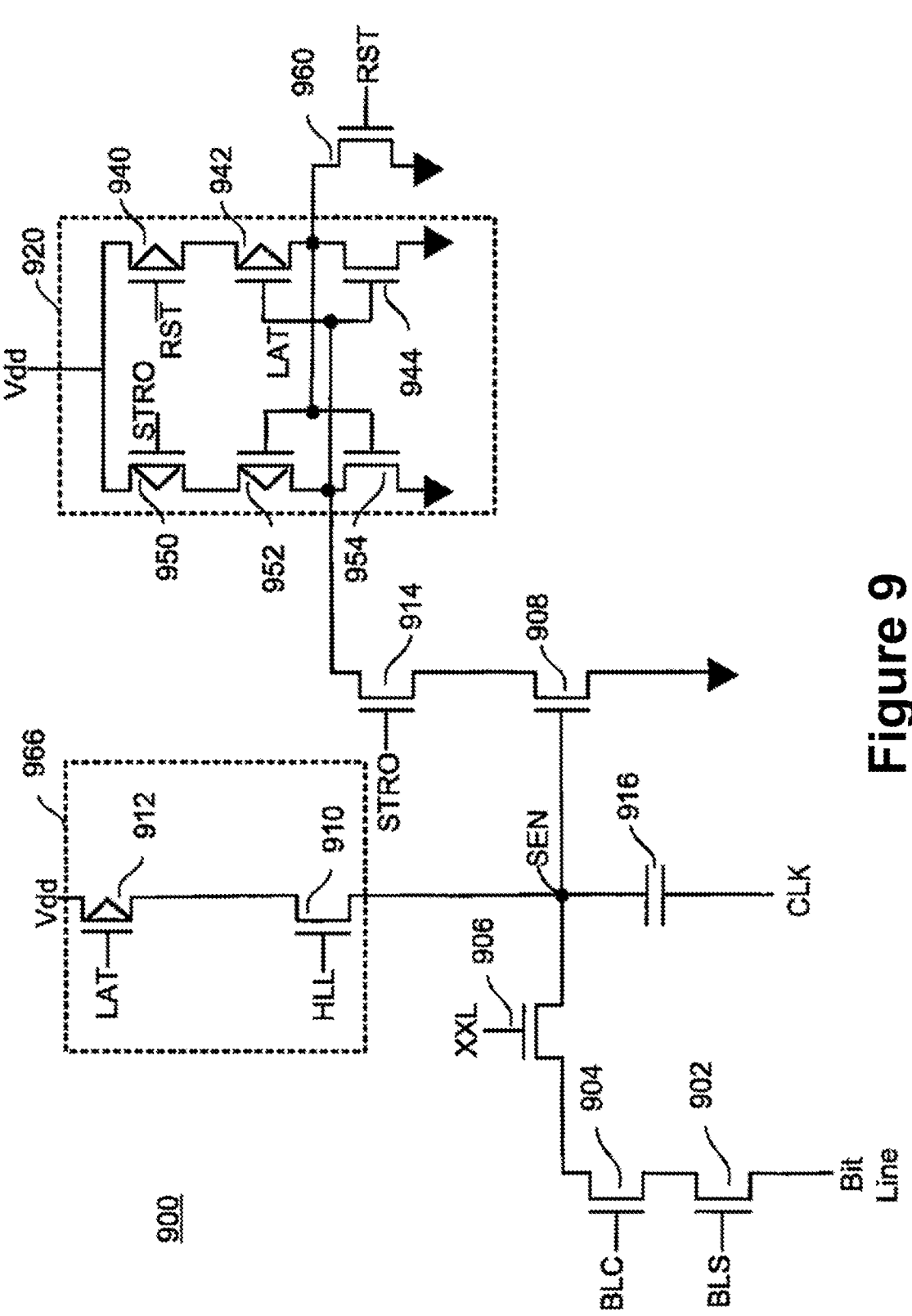
FIG. 9 is a schematic diagram depicting one embodiment sense circuitry according to aspects of the disclosure.

FIG. 9 is a schematic diagram depicting one embodiment sense circuitry 900. The sense circuitry 900 could be used during process 700, 800, as well as process 1000 described below. As described below, the circuit 900 will pre-charge a capacitor (or other charge storage device) to a pre-charge magnitude, discharge the capacitor through the memory cell for a sensing time, and sense voltage at the capacitor after the sensing time. Though FIG. 9 features one capacitor 916, in some embodiments, any suitable charge storage device can replace or complement this capacitor 916. The sense voltage will be indicative of whether the memory cell conducted the current being sensed for, which is indicative of whether the threshold voltage of the memory cell is greater than or less than threshold voltage being tested for.

FIG. 9 shows transistor 902 connected to the Bit Line and transistor 904. Transistor 902 receives the signal BLS at its gate, and is used to connect to or isolate the Bit Line. Transistor 904 receives the signal BLC at its gate, and is used as a voltage clamp. The gate voltage BLC is biased at a constant voltage equal to the desired Bit Line voltage plus the threshold voltage of transistor 904. The function of transistor 904, therefore, is to maintain a constant Bit Line voltage during a sensing operation (during read or verify), even if the current through the Bit Line changes.

Transistor 904 is connected to transistor 906. Transistor 906 is connected to capacitor 916. The purpose of transistor 906 is to connect capacitor 916 to the Bit Line and disconnect capacitor 916 from the Bit Line so that capacitor 916 is in selective communication with Bit Line. In other words, transistor 906 regulates the sensing time. That is, while transistor 906 is turned on capacitor 916 can discharge through the Bit Line, and when transistor 906 is turned off capacitor 916 cannot discharge through the Bit Line.

The SEN node at which transistor 906 connects to capacitor 916 is also connected to the gate of sensing transistor 908. Thus, the upper plate of capacitor 916 is connected to the gate of sensing transistor 908. The lower plate of capacitor 916 is connected to clock signal CLK. The purpose of clock signal CLK is to raise or lower the voltage on the upper plate of the capacitor 916, and hence raise or lower the voltage on the sense node SEN.

The SEN node is also connected to transistor 910, which is connected to transistor 912. Both transistor 910 and 912 are in a pre-charge circuit 966. The signal HLL is provided to the gate of transistor 910. The signal LAT is provided to the gate of transistor 912. A purpose of transistors 910 and 912 is to pre-charge the sense node SEN. A voltage (e.g. Vdd or other voltage) is applied to the source of transistor 912. By appropriately biasing transistors 912 and 910, the voltage applied to the source of transistor 912 can be used to pre-charge capacitor 916. Pre-charging capacitor 916 is one example of establishing conditions for sensing a memory cell. After pre-charging, capacitor 916 can discharge through the Bit Line via transistor 906 (assuming that transistors 160 and 904 are conducting).

The drain of sense transistor 908 is connected to a strobe transistor 914. The gate of the strobe transistor 914 is provide with a strobe signal STRO. A purpose of the strobe transistor 914 is to connect the sensing transistor 908 to the latch circuit 920.

The latch circuit 920 includes transistors 940, 942, 944, 950, 952, and 954. Transistor 950 receives the strobe signal STRO at its gate. Transistor 940 receives a reset signal RST at its gate. The gates of transistors 952 and 954 are tied together. The LAT voltage in the data latch 920 represents a condition of the memory cell. In one embodiment, LAT will be high if the memory cell has threshold voltage at or above the reference level and low if the memory cell has a threshold voltage below the reference level. Thus, a high LAT means that the memory cell has a threshold voltage at or above the reference level, in one embodiment. Thus, a low LAT means that the memory cell has a threshold voltage below the reference level, in one embodiment.

A reset transistor 960 is connected to the gates of transistors 952 and 954. The gate of reset transistor 960 is provided with the reset signal RST. Thus, the reset signal RST may be used to reset the latch 920.

Note that although only one latch circuit 920 is depicted in FIG. 9, circuit 900 may have two or more latch circuits 920. In this case, the circuit 900 may be configured to store results in a selected latch circuit 920.

As discussed above, capacitor 916 is pre-charged via transistors 910 and 912. This will raise the voltage at the node SEN to a pre-charge voltage level (Vpre). When transistor 906 turns on, capacitor 916 can discharge its charge through the Bit Line and the selected memory cell if the threshold voltage of the memory cell is below the reference voltage level being tested for. If the capacitor 916 is able to discharge, then the voltage at the capacitor (at the SEN node) will decrease.

The pre-charge voltage (Vpre) at the SEN node is greater than the threshold voltage of transistor 908; therefore, prior to the sense time, transistor 908 is on (conducting). Since transistor 908 is on during the sense time, then transistor 914 should be off. If the capacitor 916 does not discharge during the sense time, then the voltage at the SEN node will remain above the threshold voltage of transistor 908. With the sense transistor 908 on and transistor 914 on LAT in the data latch 920 goes high, in one embodiment.

If the capacitor 916 discharges sufficiently during the sense time, then the voltage at the SEN node will decrease below the threshold voltage of transistor 908, thereby turning off transistor 908. In this case, LAT in the data latch 920 will be low, in one embodiment. The voltage at LAT in the data latch 920 may be provided to managing circuitry outside of the sense circuit 900. In one embodiment, a compliment of the voltage at LAT in the data latch 920 is provided to managing circuitry outside of the sense circuit 900. Thus, the condition of the memory cell with respect to a reference level (e.g., threshold voltage) may be determined by the sense circuit 900 and/or by managing circuitry outside of the sense circuit 900.

Figure 10:
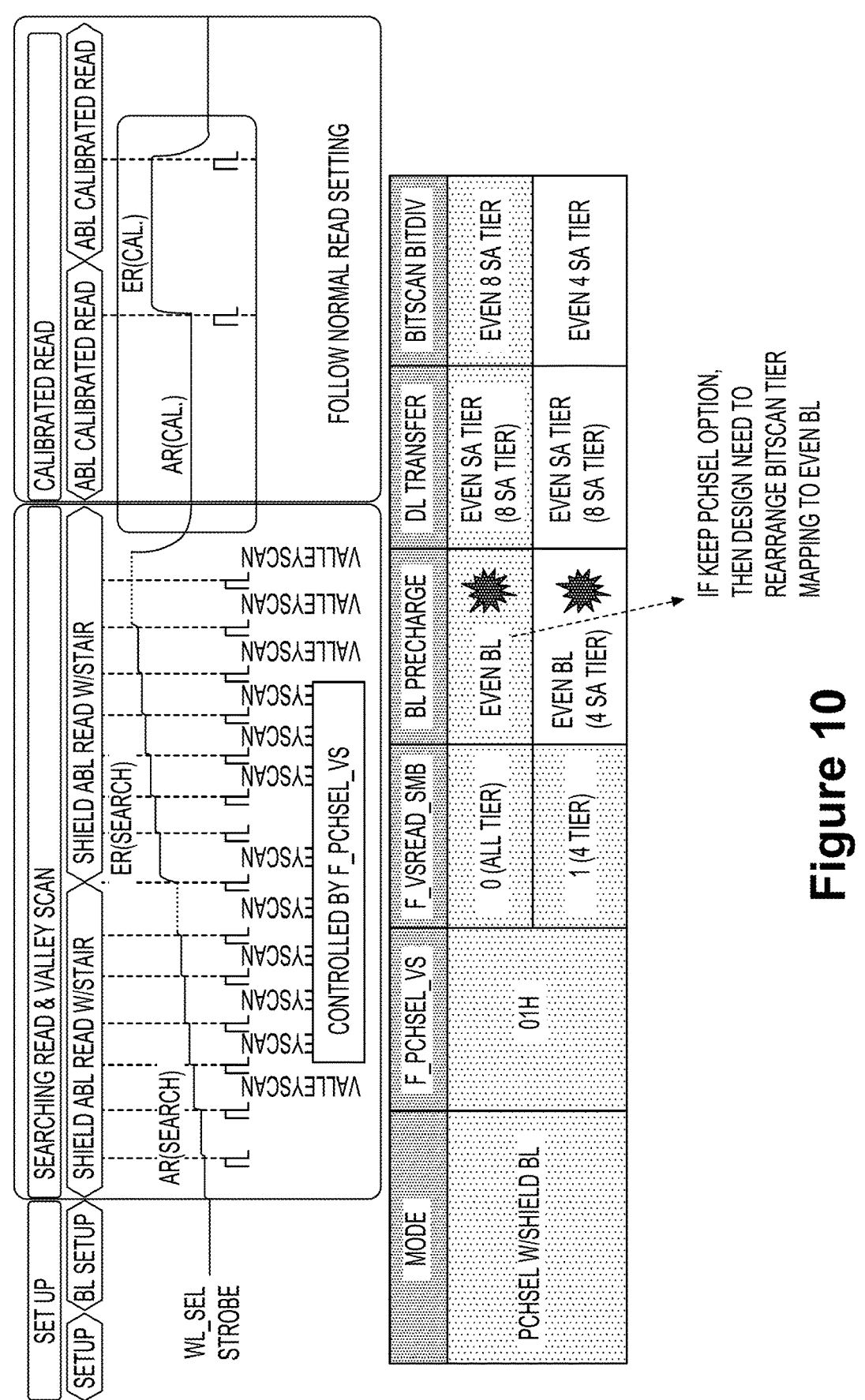
FIG. 10 shows a voltage of a selected word line during an example valley search scan and searching read followed by a calibrated read and options for a searching read according to aspects of the disclosure.
Figure 12:
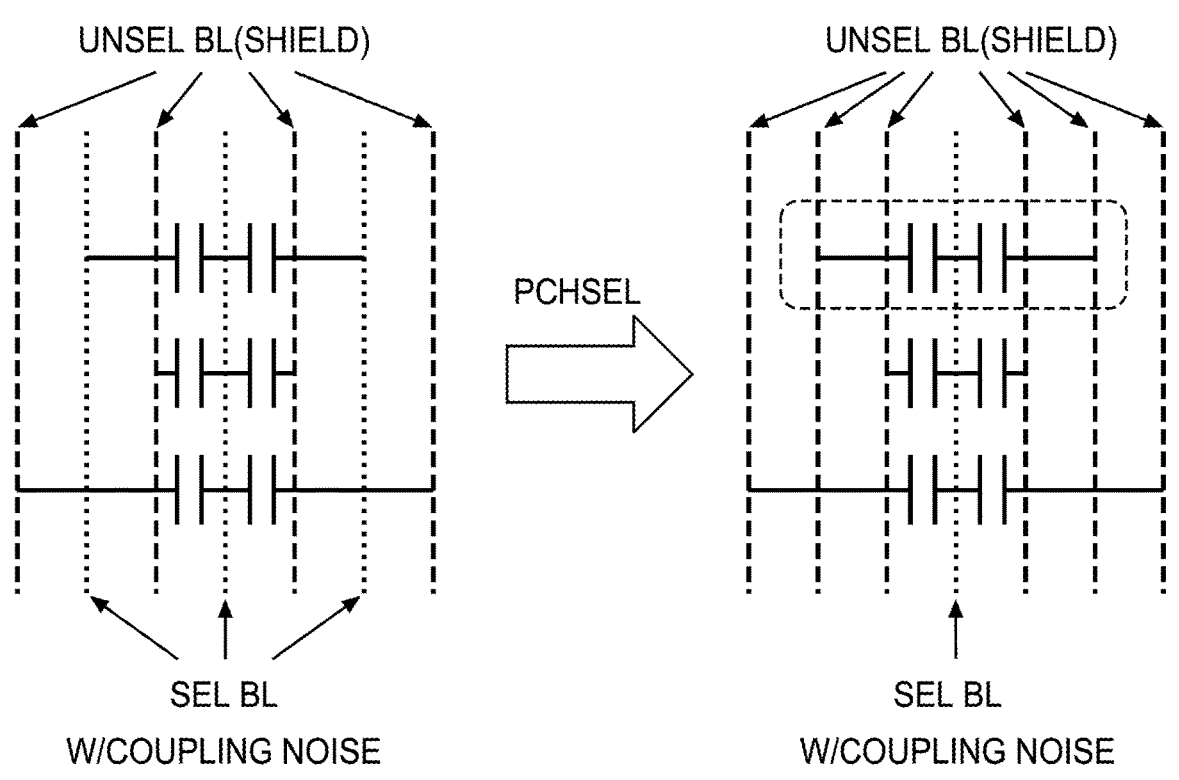
FIG. 12 shows a plurality of bit lines including unselected bit lines and selected bit lines using pre-charging and resulting coupling noise or lack thereof according to aspects of the disclosure.
Figure 13:
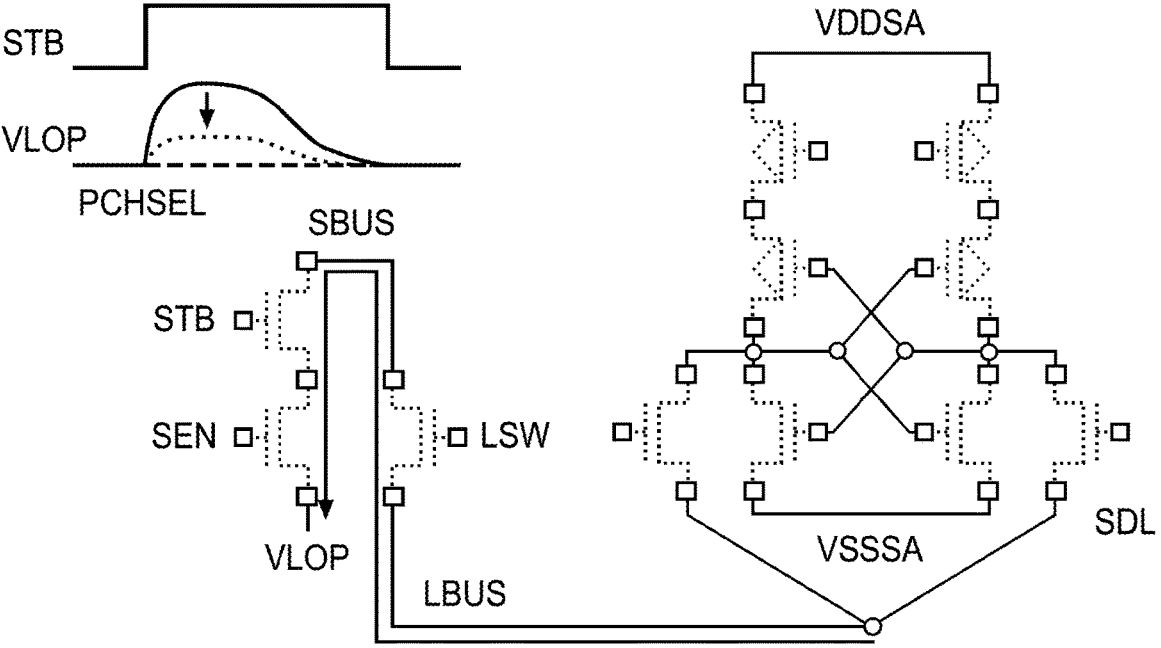
FIG. 13 shows a plot of a strobe and the effect of pre-charging as in FIG. 12 on a voltage at a portion of a sense circuit according to aspects of the disclosure.
Figure 14:
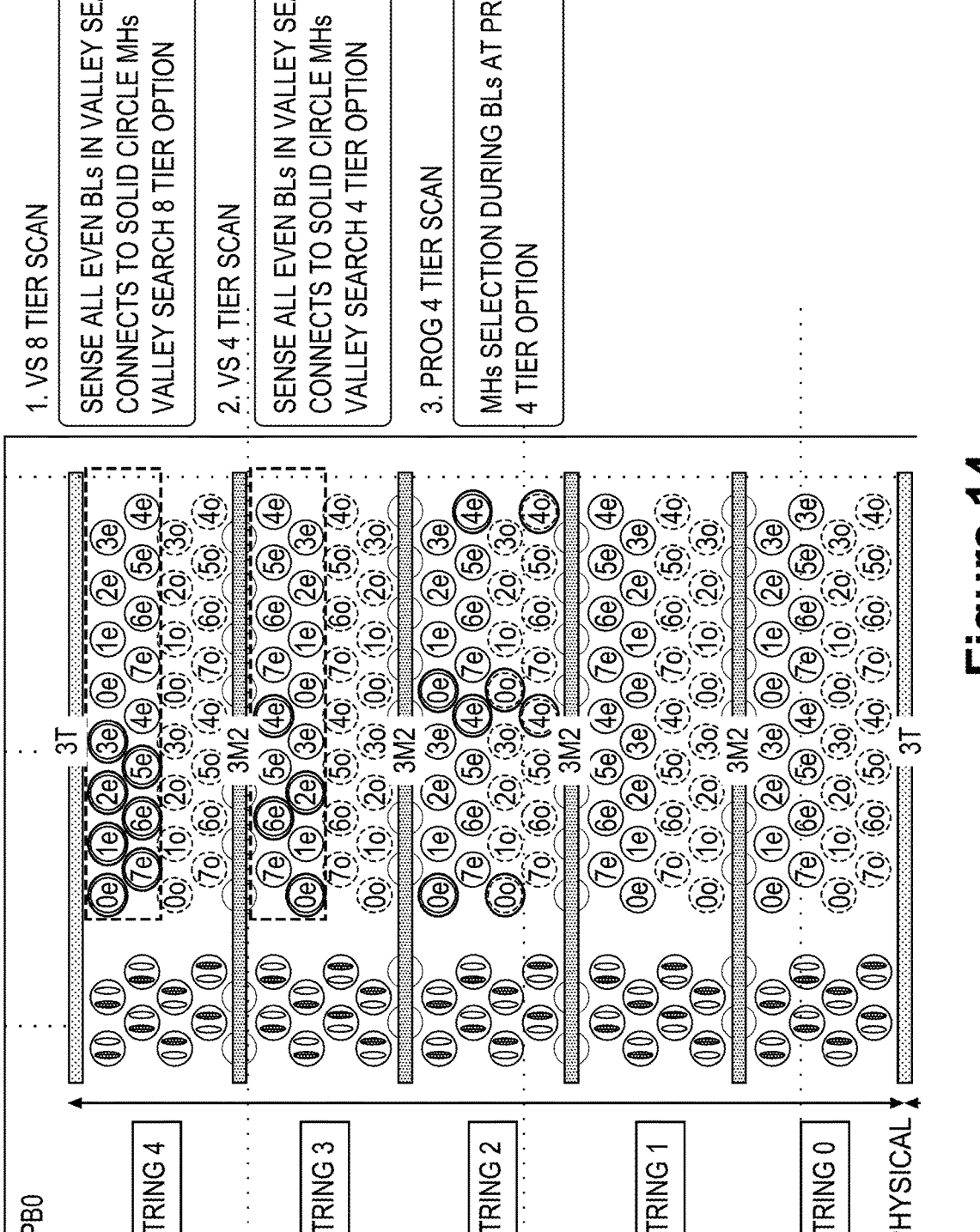
FIG. 14 shows a top view of rows of memory holes connected to even bit lines and odd bit lines and grouped in a plurality of strings according to aspects of the disclosure.
Figure 15:
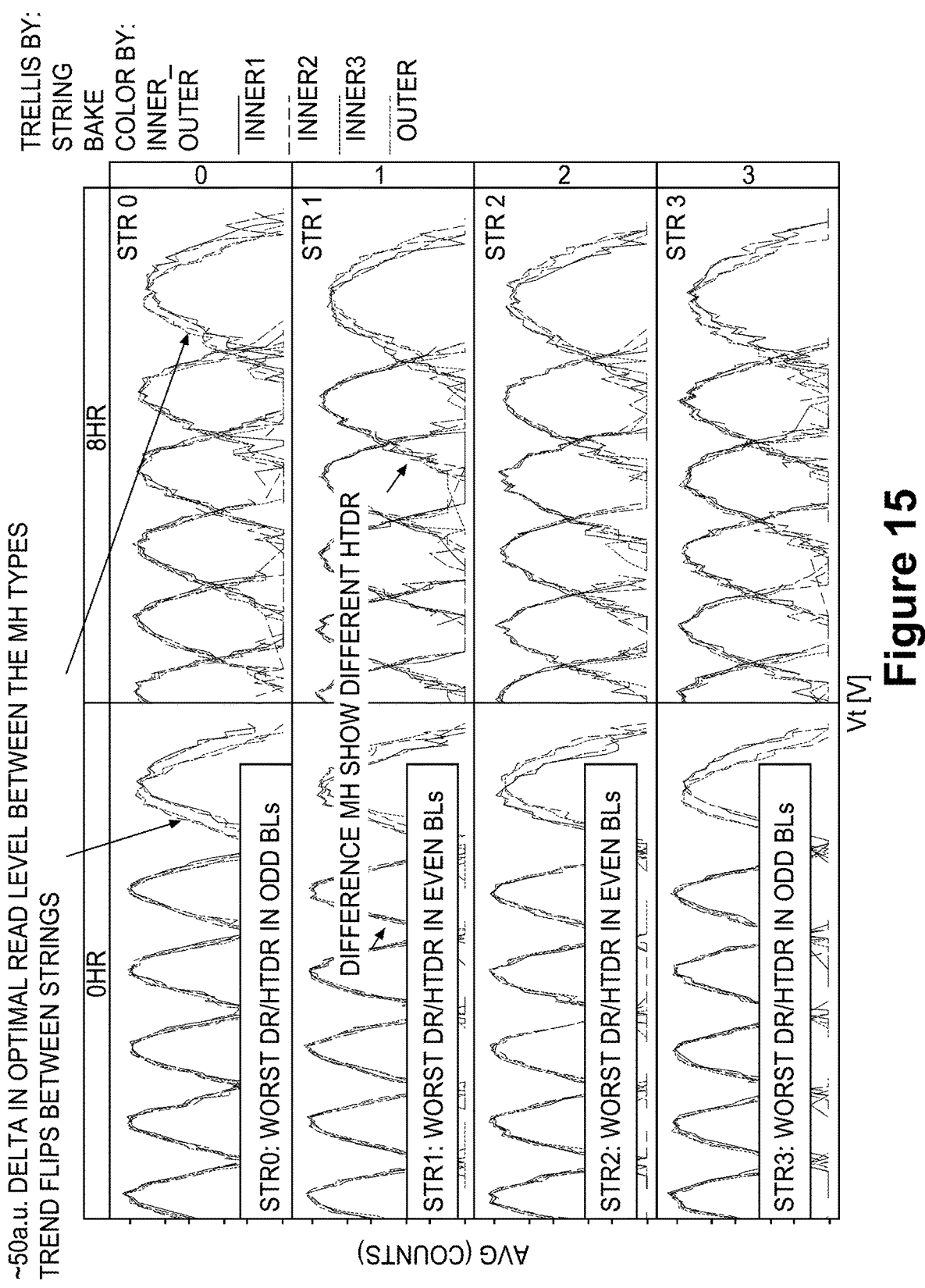
FIG. 15 shows threshold voltages of cycled memory holes of a plurality of strings of a block tested to show that threshold voltage distributions of the memory cells are dependent on memory hole types according to aspects of the disclosure.
Figure 16:
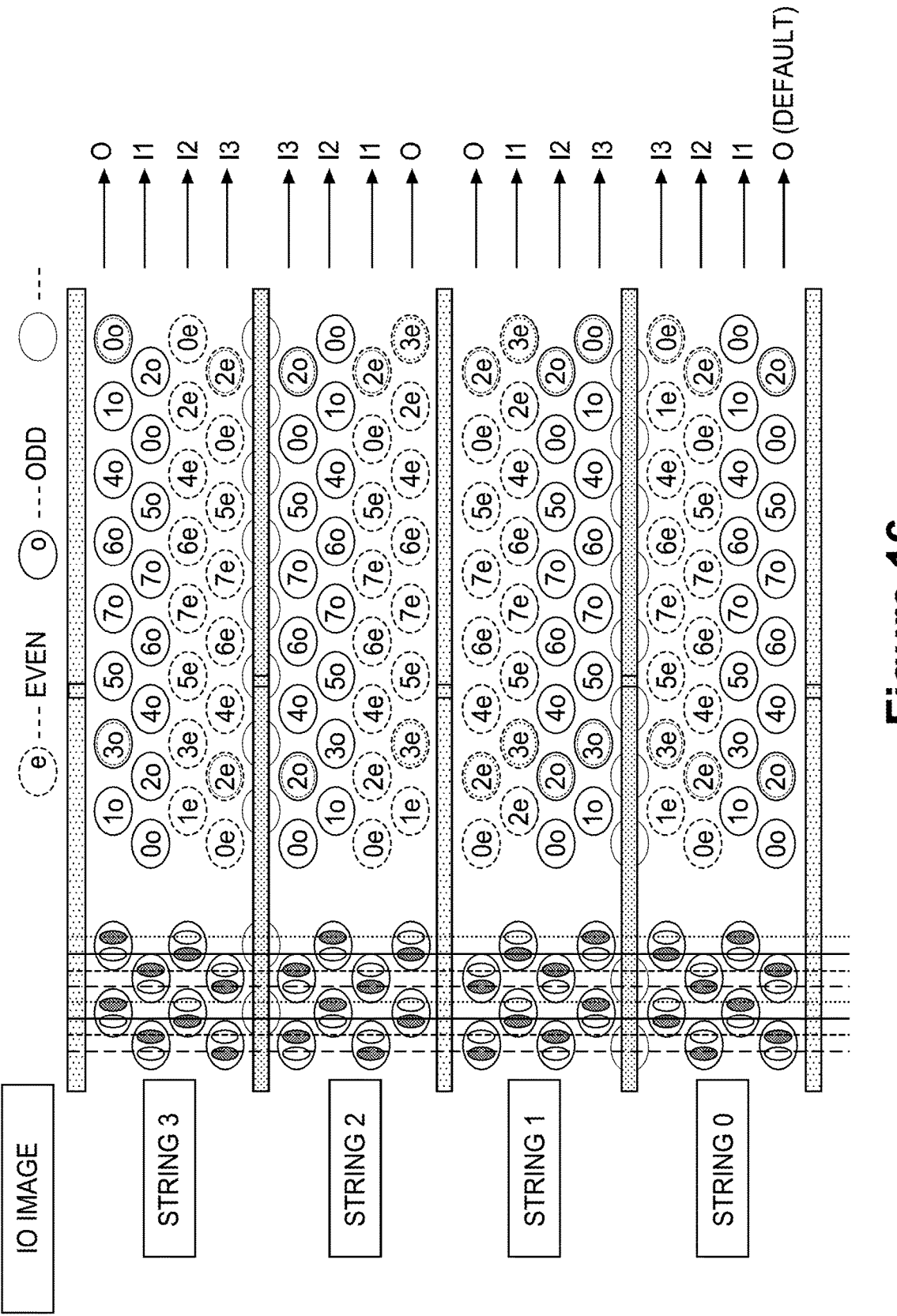
FIG. 16 shows an arrangement of the memory hole types along with those connected to the even and odd bit lines according to aspects of the disclosure.

As discussed above, using the same specific bit lines for pre-charging and reading during a valley search in every memory apparatus may not be the most ideal due to variations of the memory holes or rows of the memory holes. FIG. 10 shows a voltage of a selected word line during an example valley search scan and searching read followed by a calibrated read and options for the searching read. As shown, the searching read and valley scan only implement the pre-charging (PCHSEL) with shield bit line option and therefore only pre-charge the even ones of the bit lines. Specifically, if the pre-charging PCHSEL option is used, the bitscan tier mapping needs to be changed to the even ones of the bit lines. FIG. 11 shows a chart illustrating additional details about the searching read. No lockout or PCHSEL is used for the searching read and the neighbor bit line noise is good for PCHSEL with shield bit line option as compared to NO-LOCKOUT WITH ABL. FIG. 12 shows a plurality of bit lines including unselected bit lines (BL) and selected bit lines using pre-charging and resulting coupling noise or lack thereof. So, as shown on the right hand side of FIG. 12, PCHSEL helps reduce coupling noise from neighboring bit lines as only one of the bit lines of the group is selected and the remaining bit lines are used to shield. FIG. 13 shows a plot of a strobe (STB) and the effect of pre-charging as in FIG. 12 on a voltage VLOP at a portion of a sense circuit. Using PCHSEL also helps reduce data pattern dependence during the sense operation (e.g., read operation) with a small bounce of the voltage VLOP and stabilizing the sense operation. FIG. 14 shows a top view of rows of memory holes connected to even bit lines (solid circles) and odd bit lines (dashed circles) and grouped in a plurality of strings STRING 0-STRING 4. The searching read and valley scan implemented with the pre-charging (PCHSEL) with shield bit line option only scans the even bit lines, so only two out of the four memory hole types (e.g., starting from an edge of the stack, an outer row along the edge of the stack O, a first inner row adjacent to the outer row I1, a second inner row I2 adjacent the first inner row, and a third inner row I3 adjacent the second inner row) are covered. FIG. 15 shows threshold voltages of cycled memory holes of a plurality of strings of a block tested to show that the threshold voltage distributions of the memory cells are dependent on memory hole (MH) types. FIG. 16 shows the arrangement of the memory hole types O, I1, I2, I3 along with those connected to the even and odd bit lines. As shown in FIG. 15, an approximate 50 a.u. delta in optimal read level exists between different memory hole types and the trend flips between strings.

Consequently, described herein is a memory apparatus (e.g., memory device 100 of FIG. 2) including memory cells (e.g., memory cell MC1-MC5 of FIG. 4E) connected to one of a plurality of word lines (e.g., data word line layers (word lines) WLL0-WLL31 of FIGS. 4C and 4D or WLL27-WLL31 of FIG. 4E). The memory cells are disposed in vertical columns or memory holes (e.g., vertical columns 432, 434 of FIG. 4C and vertical column 432 of FIG. 4E) coupled to one of a plurality of bit lines (e.g., set of bit lines 412 of FIG. 4B). The memory cells are configured to retain a threshold voltage Vt or Vth corresponding to one of a plurality of memory or data states (e.g., FIGS. 5A and 5B). The memory apparatus also includes a control circuit or means (e.g., one or any combination of control circuitry 110, decoders 114/124/132, power control module 116, sense blocks SB1, SB2, . . . , SBp, read/write circuits 128, controller 122 of FIG. 2, read adjustment circuitry 720 of FIG. 7A, and/or sense circuitry 900 of FIG. 9 and so forth) coupled to the plurality of word lines and the plurality of bit lines. For a group of the memory cells divided into a plurality of subsets, the control means is configured to determine whether comparatively fewer read errors of the memory cells arise while pre-charging ones of the plurality of bit lines associated with each of the plurality of subsets. The control means is also configured to pre-charge ones of the plurality of bit lines associated with one the plurality of subsets with comparatively fewer read errors and read the memory cells associated therewith during a scan operation.

As discussed above, the memory apparatus can further include an error correction algorithm (e.g., stored in RAM one 122b of controller 122 in FIG. 2) configured to detect the read errors when reading the memory cells and for the group of the memory cells divided into the plurality of subsets, the control means is further configured to pre-charge ones of the plurality of bit lines associated with one of the plurality of subsets and sense at least some of the of the memory cells in the one of the plurality of subsets to determine a first quantity of the read errors of the memory cells while pre-charging ones of the plurality of bit lines associated with the one of the plurality of subsets using the error correction algorithm. In addition, for the group of the memory cells divided into the plurality of subsets, the control means is configured to pre-charge ones of the plurality of bit lines associated with another of the plurality of subsets and sense at least some of the of the memory cells in the another of the plurality of subsets to determine a second quantity of the read errors of the memory cells while pre-charging ones of the plurality of bit lines associated with the another of the plurality of subsets using the error correction algorithm. The control means determines whether the first quantity is less than the second quantity and pre-charges ones of the plurality of bit lines associated with the one of the plurality of subsets and read the memory cells associated therewith during the scan operation in response to the first quantity being less than the second quantity. The control means additionally is configured to pre-charge ones of the plurality of bit lines associated with the another of the plurality of subsets and read the memory cells associated therewith during the scan operation in response to the first quantity not being less than the second quantity.

According to another aspect, the scan operation is a valley scan operation and the control means is further configured to pre-charge the ones of the plurality of bit lines associated with the one the plurality of subsets with comparatively fewer read errors and read the memory cells associated therewith at each of a plurality of reference levels corresponding with at least one of the plurality of data states. The control means is also configured to determine an adjusted read level for at least one of the plurality of data states based on a comparison of reading at one of the plurality of reference levels with results of reading at others of the reference levels.

Referring back to FIGS. 4C-4E, the plurality of the plurality of word lines and a plurality of dielectric layers extend horizontally and overlay one another in an alternating fashion in a stack. The memory holes extend vertically through the stack. The memory cells are connected in series between a drain-side select gate transistor (e.g., drain side select layers SGD1 and SGD2 of FIG. 4C) on a drain-side of each of the memory holes and connected to the one of the plurality of bit lines and a source-side select gate transistor (drain side select layers SGS1 and SGS2 of FIG. 4C) on a source-side of each of the memory holes and connected to a source line (e.g., source line SL of FIG. 4C). The memory holes are organized in rows grouped in a plurality of strings (e.g., regions 420, 430, 440, and 450 of FIG. 4B and STRING 0-STRING 4 of FIG. 14). The plurality of bit lines includes even bit lines and odd bit lines alternating with one another (e.g., as indicated in FIG. 14). The plurality of subsets of the group of the memory cells include memory cells of the memory holes coupled to the even bit lines and memory cells of the memory holes coupled to the odd bit lines.

According to an aspect and referring back to FIG. 14, the plurality of strings are arranged horizontally and can include a first string STRING 0 and a second string STRING 1 and a third string STRING 2 and a fourth string STRING 3 and a fifth string STRING 4. The memory apparatus can further include the plurality of valley scan bit line selection parameters each stored in separate memory addresses. The plurality of valley scan bit line selection parameters are indicative of whether the odd bit lines or even bit lines should be pre-charged and the memory cells associated therewith should be read during the valley scan operation for each of the plurality of strings. FIG. 17 shows examples of the plurality of valley scan bit line selection parameters. As shown, the plurality of valley scan bit line selection parameters includes a first string valley scan bit line selection parameter VS_SCAN_BL_STR0 associated with the first string STRING 0. Similarly, the plurality of valley scan bit line selection parameters also includes a second string valley scan bit line selection parameter VS_SCAN_BL_STR1 associated with the second string STRING 1. The plurality of valley scan bit line selection parameters additionally includes a third string valley scan bit line selection parameter VS_SCAN_BL_STR2 associated with the third string STRING 2. In addition, the plurality of valley scan bit line selection parameters includes a fourth string valley scan bit line selection parameter VS_SCAN_BL_STR3 associated with the fourth string STRING 3 and a fifth string valley scan bit line selection parameter associated with the fifth string STRING 4.

So, according to another aspect, the control means is further configured to enable the valley scan operation and determine which one of the plurality of strings is being scanned in the valley scan operation. The control means is also configured to check the first string valley scan bit line selection parameter VS_SCAN_BL_STR0 in response to determining the first string STRING 0 is being scanned in the valley scan operation. In addition, the control means is configured to pre-charge the odd bit lines coupled to the memory holes of the first string STRING 0 and read the memory cells associated therewith during the valley scan operation in response to the first string valley scan bit line selection parameter VS_SCAN_BL_STR0 indicating the odd bit lines. The control means also pre-charges the even bit lines coupled to the memory holes of the first string STRING 0 and reads the memory cells associated therewith during the valley scan operation in response to the first string valley scan bit line selection parameter VS_SCAN_BL_STR0 indicating the odd bit lines.

The control means is additionally configured to check the second string valley scan bit line selection parameter VS_SCAN_BL_STR1 in response to determining the second string STRING 1 is being scanned in the valley scan operation. The control means then pre-charges the odd bit lines coupled to the memory holes of the second string STRING 1 and reads the memory cells associated therewith during the valley scan operation in response to the second string valley scan bit line selection parameter VS_SCAN_BL_STR1 indicating the odd bit lines. The control means is also configured to pre-charge the even bit lines coupled to the memory holes of the second string STRING 1 and read the memory cells associated therewith during the valley scan operation in response to the second string valley scan bit line selection parameter VS_SCAN_BL_STR1 indicating the odd bit lines.

Furthermore, the control means is configured to check the third string valley scan bit line selection parameter VS_SCAN_BL_STR2 in response to determining the third string STRING 2 is being scanned in the valley scan operation. The control means pre-charges the odd bit lines coupled to the memory holes of the third string STRING 2 and reads the memory cells associated therewith during the valley scan operation in response to the third string valley scan bit line selection parameter VS_SCAN_BL_STR2 indicating the odd bit lines. The control means additionally is configured to pre-charge the even bit lines coupled to the memory holes of the third string STRING 2 and read the memory cells associated therewith during the valley scan operation in response to the third string valley scan bit line selection parameter VS_SCAN_BL_STR2 indicating the odd bit lines.

In addition, the control means is configured to check the fourth string valley scan bit line selection parameter VS_S-CAN_BL_STR3 in response to determining the fourth string STRING 3 is being scanned in the valley scan operation. The control means then pre-charges the odd bit lines coupled to the memory holes of the fourth string STRING 3 and reads the memory cells associated therewith during the valley scan operation in response to the fourth string valley scan bit line selection parameter VS_SCAN_BL_STR3 indicating the odd bit lines. The control means also pre-charges the even bit lines coupled to the memory holes of the fourth string STRING 3 and reads the memory cells associated therewith during the valley scan operation in response to the fourth string valley scan bit line selection parameter VS_SCAN_BL_STR3 indicating the odd bit lines.

The control means is also configured to check the fifth string valley scan bit line selection parameter VS_SCAN_BL_STR4 in response to determining the fifth string STRING 4 is being scanned in the valley scan operation. Additionally, the control is configured to pre-charge the odd bit lines coupled to the memory holes of the fifth string STRING 4 and read the memory cells associated therewith during the valley scan operation in response to the fifth string valley scan bit line selection parameter VS_SCAN_BL_STR4 indicating the odd bit lines. The control means pre-charges the even bit lines coupled to the memory holes of the fifth string STRING 4 and reads the memory cells associated therewith during the valley scan operation in response to the fifth string valley scan bit line selection parameter VS_SCAN_BL_STR4 indicating the odd bit lines.

Referring back to FIG. 9, the memory apparatus can further include at least one capacitor (e.g., cap 916 of FIG. 9) coupled to each of the plurality of bit lines and configured to store an electrical charge. The control means is further configured to pre-charge the at least one capacitor to a pre-charge magnitude and discharge the at least one capacitor through each of the memory cells being read for a sensing time and sense a voltage of the at least one capacitor after the sensing time.

Figure 19:
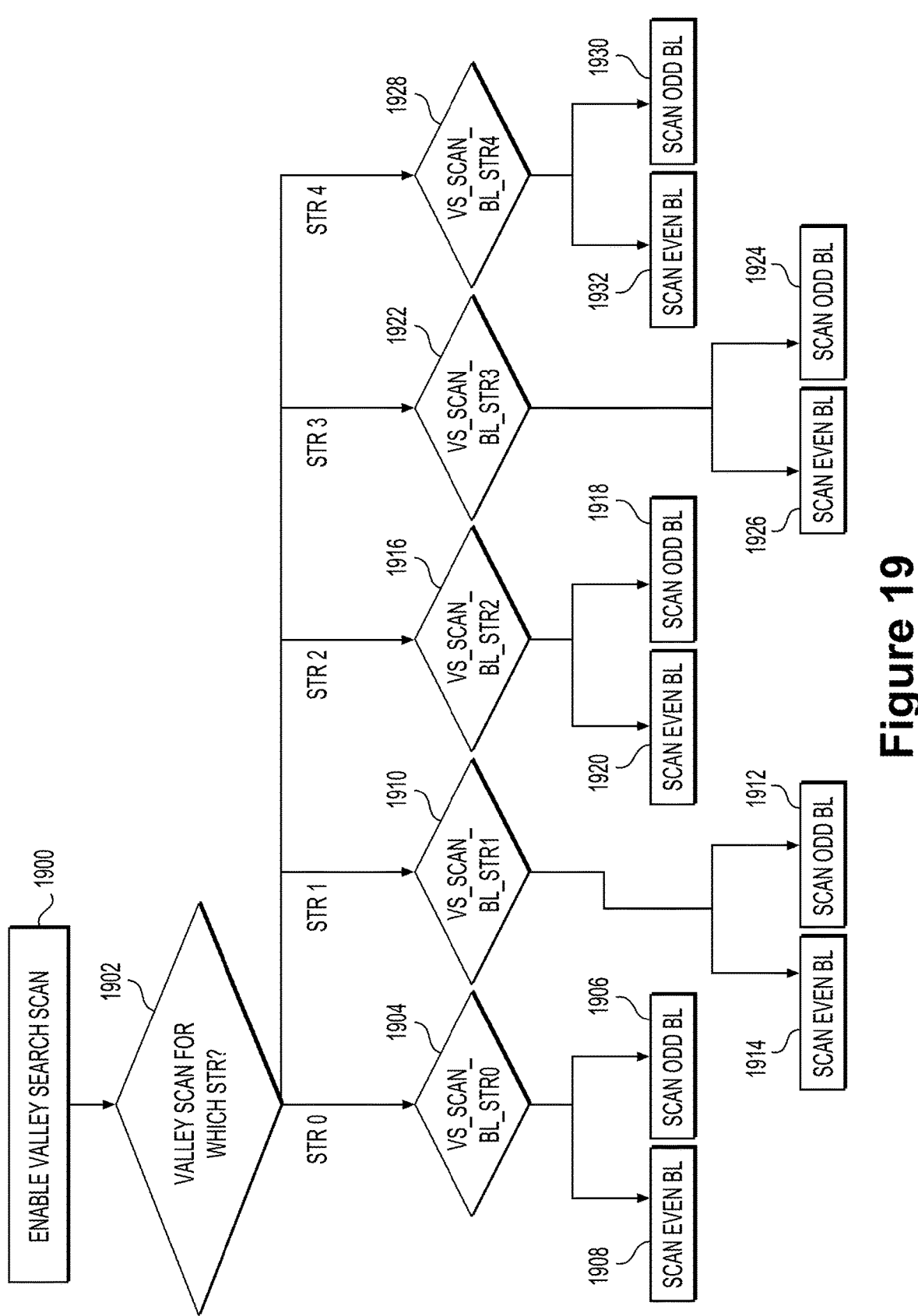

FIGS. 18 and 19 illustrate steps of a method of operating a memory apparatus. As discussed above, the memory apparatus (e.g., memory device 100 of FIG. 2) includes memory cells (e.g., memory cell MC1-MC5 of FIG. 4E) connected to one of a plurality of word lines (e.g., data word line layers (word lines) WLL0-WLL31 of FIGS. 4C and 4D or WLL27-WLL31 of FIG. 4E). The memory cells are disposed in memory holes (e.g., vertical columns 432, 434 of FIG. 4C and vertical column 432 of FIG. 4E) coupled to one of a plurality of bit lines (e.g., set of bit lines 412 of FIG. 4B). The memory cells are configured to retain a threshold voltage Vt or Vth corresponding to one of a plurality of memory or data states (e.g., FIGS. 5A and 5B). Referring initially to FIG. 18, the method includes the step of 1800 for a group of the memory cells divided into a plurality of subsets, determining whether comparatively fewer read errors of the memory cells arise while pre-charging ones of the plurality of bit lines associated with each of the plurality of subsets. The method also includes the step of 1802 pre-charging ones of the plurality of bit lines associated with one the plurality of subsets with comparatively fewer read errors and reading the memory cells associated therewith during a scan operation.

As discussed above, the memory apparatus can further include the error correction algorithm (e.g., stored in RAM one 122b of controller 122 in FIG. 2) configured to detect the read errors when reading the memory cells. Thus, the method can further include the step of for the group of the memory cells divided into the plurality of subsets, pre-charging ones of the plurality of bit lines associated with one of the plurality of subsets and sensing at least some of the of the memory cells in the one of the plurality of subsets to determine a first quantity of the read errors of the memory cells while pre-charging ones of the plurality of bit lines associated with the one of the plurality of subsets using the error correction algorithm. The method can also include the step of for the group of the memory cells divided into the plurality of subsets, pre-charging ones of the plurality of bit lines associated with another of the plurality of subsets and sensing at least some of the of the memory cells in the another of the plurality of subsets to determine a second quantity of the read errors of the memory cells while pre-charging ones of the plurality of bit lines associated with the another of the plurality of subsets using the error correction algorithm. Next, determining whether the first quantity is less than the second quantity. The method can continues with the step of pre-charging ones of the plurality of bit lines associated with the one of the plurality of subsets and reading the memory cells associated therewith during the scan operation in response to the first quantity being less than the second quantity. The method can also include the step of pre-charging ones of the plurality of bit lines associated with the another of the plurality of subsets and reading the memory cells associated therewith during the scan operation in response to the first quantity not being less than the second quantity.

As discussed above, the scan operation can be the valley scan operation. So, according to an aspect, the method further includes the step of pre-charging the ones of the plurality of bit lines associated with the one the plurality of subsets with comparatively fewer read errors and reading the memory cells associated therewith at each of a plurality of reference levels corresponding with at least one of the plurality of data states. The method also includes the step of determining an adjusted read level for at least one of the plurality of data states based on a comparison of reading at one of the plurality of reference levels with results of reading at others of the reference levels.

Again, referring back to FIGS. 4C-4E, the plurality of the plurality of word lines and the plurality of dielectric layers can extend horizontally and overlay one another in an alternating fashion in the stack. The memory holes can then extend vertically through the stack. The memory cells are connected in series between the drain-side select gate transistor (e.g., drain side select layers SGD1 and SGD2 of FIG. 4C) on the drain-side of each of the memory holes and connected to the one of the plurality of bit lines and the source-side select gate transistor (drain side select layers SGS1 and SGS2 of FIG. 4C) on the source-side of each of the memory holes and connected to the source line (e.g., source line SL of FIG. 4C). The memory holes are organized in rows grouped in the plurality of strings (e.g., regions 420, 430, 440, and 450 of FIG. 4B and STRING 0-STRING 4 of FIG. 14). The plurality of bit lines includes the even bit lines and the odd bit lines alternating with one another. The plurality of subsets of the group of the memory cells include memory cells of the memory holes coupled to the even bit lines and memory cells of the memory holes coupled to the odd bit lines.

Again, according to an aspect and referring back to FIG. 14, the plurality of strings are arranged horizontally and can include the first string STRING 0 and the second string STRING 1 and the third string STRING 2 and the fourth string STRING 3 and the fifth string STRING 4. The memory apparatus can further include the plurality of valley scan bit line selection parameters each stored in separate memory addresses. As above, the plurality of valley scan bit line selection parameters are indicative of whether the odd bit lines or even bit lines should be pre-charged and the memory cells associated therewith should be read during the valley scan operation for each of the plurality of strings. Referring back to FIG. 17, the plurality of valley scan bit line selection parameters includes the first string valley scan bit line selection parameter VS_SCAN_BL_STR0 associated with the first string STRING 0. Similarly, the plurality of valley scan bit line selection parameters also includes the second string valley scan bit line selection parameter VS_S-CAN_BL_STR1 associated with the second string STRING 1. The plurality of valley scan bit line selection parameters additionally includes the third string valley scan bit line selection parameter VS_SCAN_BL_STR2 associated with the third string STRING 2. In addition, the plurality of valley scan bit line selection parameters includes the fourth string valley scan bit line selection parameter VS_SCAN_BL_STR3 associated with the fourth string STRING 3 and the fifth string valley scan bit line selection parameter VS_S-CAN_BL_STR4 associated with the fifth string STRING 4. Thus, according to another aspect and referring to FIG. 19, the method further includes the step of 1900 enabling the valley scan operation. The next step of the method is 1902 determining which one of the plurality of strings is being scanned in the valley scan operation. The method also includes the step of 1904 checking the first string valley scan bit line selection parameter VS_SCAN_BL_STR0 in response to determining the first string STRING 0 is being scanned in the valley scan operation. The method proceeds by 1906 pre-charging the odd bit lines coupled to the memory holes of the first string STRING 0 and reading the memory cells associated therewith during the valley scan operation in response to the first string valley scan bit line selection parameter VS_SCAN_BL_STR0 indicating the odd bit lines. Next, 1908 pre-charging the even bit lines coupled to the memory holes of the first string STRING 0 and reading the memory cells associated therewith during the valley scan operation in response to the first string valley scan bit line selection parameter VS_SCAN_BL_STR0 indicating the odd bit lines.

The method also includes the step of 1910 checking the second string valley scan bit line selection parameter VS_S-CAN_BL_STR1 in response to determining the second string STRING 1 is being scanned in the valley scan operation. The method continues by 1912 pre-charging the odd bit lines coupled to the memory holes of the second string STRING 1 and reading the memory cells associated therewith during the valley scan operation in response to the second string valley scan bit line selection parameter VS_S-CAN_BL_STR1 indicating the odd bit lines. The next step of the method is 1914 pre-charging the even bit lines coupled to the memory holes of the second string STRING 1 and reading the memory cells associated therewith during the valley scan operation in response to the second string valley scan bit line selection parameter VS_SCAN_BL_STR1 indicating the odd bit lines.

The method additionally includes the step of 1916 checking the third string valley scan bit line selection parameter VS_SCAN_BL_STR2 in response to determining the third string STRING 2 is being scanned in the valley scan operation. The method proceeds with the step of 1918 pre-charging the odd bit lines coupled to the memory holes of the third string STRING 2 and reading the memory cells associated therewith during the valley scan operation in response to the third string valley scan bit line selection parameter VS_SCAN_BL_STR2 indicating the odd bit lines. Next, 1920 pre-charging the even bit lines coupled to the memory holes of the third string STRING 2 and reading the memory cells associated therewith during the valley scan operation in response to the third string valley scan bit line selection parameter VS_SCAN_BL_STR2 indicating the odd bit lines.

The method further includes the step of 1922 checking the fourth string valley scan bit line selection parameter VS_S-CAN_BL_STR3 in response to determining the fourth string STRING 3 is being scanned in the valley scan operation. The method continues by 1924 pre-charging the odd bit lines coupled to the memory holes of the fourth string STRING 3 and reading the memory cells associated therewith during the valley scan operation in response to the fourth string valley scan bit line selection parameter VS_SCAN_BL-_STR3 indicating the odd bit lines. The next step of the method is 1926 pre-charging the even bit lines coupled to the memory holes of the fourth string STRING 3 and reading the memory cells associated therewith during the valley scan operation in response to the fourth string valley scan bit line selection parameter VS_SCAN_BL_STR3 indicating the odd bit lines.

The method also includes the step of 1928 checking the fifth string valley scan bit line selection parameter VS_S-CAN_BL_STR4 in response to determining the fifth string STRING 4 is being scanned in the valley scan operation. The method proceeds by 1930 pre-charging the odd bit lines coupled to the memory holes of the fifth string STRING 4 and reading the memory cells associated therewith during the valley scan operation in response to the fifth string valley scan bit line selection parameter VS_SCAN_BL_STR4 indicating the odd bit lines. The method continues with the step of 1932 pre-charging the even bit lines coupled to the memory holes of the fifth string STRING 4 and reading the memory cells associated therewith during the valley scan operation in response to the fifth string valley scan bit line selection parameter VS_SCAN_BL_STR4 indicating the odd bit lines.

Referring back to FIG. 9, the memory apparatus can further include the at least one capacitor (e.g., cap 916 of FIG. 9) coupled to each of the plurality of bit lines and configured to store an electrical charge. So, according to an aspect, the method further includes the step of pre-charging the at least one capacitor to a pre-charge magnitude and discharging the at least one capacitor through each of the memory cells being read for a sensing time and sensing a voltage of the at least one capacitor after the sensing time.

The memory apparatus and method of operation disclosed herein provides numerous advantages. Specifically, because the memory apparatus and method of operation disclosed herein pre-charges ones of the plurality of bit lines associated with one the plurality of subsets with comparatively fewer read errors and reads the memory cells associated therewith during the valley scan operation, the adjusted read levels determined by the valley scan can help account for memory hole and/or string variation.

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

Additionally, when a layer or element is referred to as being "on" another layer or substrate, in can be directly on the other layer of substrate, or intervening layers may also be present. Further, it will be understood that when a layer is referred to as being "under" another layer, it can be directly under, and one or more intervening layers may also be present. Furthermore, when a layer is referred to as "between" two layers, it can be the only layer between the two layers, or one or more intervening layers may also be present.

As described herein, a controller includes individual circuit components, an application-specific integrated circuit (ASIC), a microcontroller with controlling software, a digital signal processor (DSP), a processor with controlling software, a field programmable gate array (FPGA), or combinations thereof.

What is claimed is:

1. A memory apparatus, comprising:
memory cells connected to one of a plurality of word lines and disposed in memory holes each coupled to one of a plurality of bit lines, the memory cells configured to retain a threshold voltage corresponding to one of a plurality of data states; and
a control means coupled to the plurality of word lines and the plurality of bit lines and configured to:
for a group of the memory cells divided into a plurality of subsets including a first subset and a second subset, determine whether fewer read errors of the memory cells arise while pre-charging the plurality of bit lines associated with the first subset or with the second subset, and
pre-charge only the plurality of bit lines associated with the one of the first and the second of subsets that has been determined to have fewer read errors and then read the memory cells associated therewith during a valley scan operation, wherein the memory holes are organized in rows grouped in a plurality of strings and, for each string, the control means is configured to perform said determination for the string and, during the valley scan operation, to pre-charge and read only the selected one of the first and second subsets at each of a plurality of reference levels.

2. The memory apparatus as set forth in claim 1, further including an error correction algorithm configured to detect the read errors when reading the memory cells and the control means is further configured to:
for the group of the memory cells divided into the plurality of subsets, pre-charge ones of the plurality of bit lines associated with one of the plurality of subsets and sense at least some of the memory cells in the one of the plurality of subsets to determine a first quantity of the read errors of the memory cells while pre-charging ones of the plurality of bit lines associated with the one of the plurality of subsets using the error correction algorithm,
for the group of the memory cells divided into the plurality of subsets, pre-charge ones of the plurality of bit lines associated with another of the plurality of subsets and sense at least some of the memory cells in the another of the plurality of subsets to determine a second quantity of the read errors of the memory cells while pre-charging ones of the plurality of bit lines associated with the another of the plurality of subsets using the error correction algorithm,
determine whether the first quantity is less than the second quantity,
pre-charge ones of the plurality of bit lines associated with the one of the plurality of subsets and read the memory cells associated therewith during the valley scan operation in response to the first quantity being less than the second quantity, and
pre-charge ones of the plurality of bit lines associated with the another of the plurality of subsets and read the memory cells associated therewith during the valley scan operation in response to the first quantity not being less than the second quantity.

3. The memory apparatus as set forth in claim 1, wherein the control means is further configured to
determine an adjusted read level for at least one of the plurality of data states based on a comparison of reading at one of the plurality of reference levels with results of reading at others of the reference levels.

4. The memory apparatus as set forth in claim 1, wherein the plurality of word lines and a plurality of dielectric layers extend horizontally and overlay one another in an alternating fashion in a stack, the memory holes extend vertically through the stack, the memory cells are connected in series between a drain-side select gate transistor on a drain-side of each of the memory holes and connected to the one of the plurality of bit lines and a source-side select gate transistor on a source-side of each of the memory holes and connected to a source line, the memory holes are organized in rows grouped in a plurality of strings, the plurality of bit lines includes even bit lines and odd bit lines alternating with one another, the first subset including memory cells of the memory holes coupled to the even bit lines and the second subset including memory cells of the memory holes coupled to the odd bit lines.

5. The memory apparatus as set forth in claim 4, further including a plurality of valley scan bit line selection parameters each stored in separate memory addresses and indicative of whether the odd bit lines or even bit lines should be pre-charged and the memory cells associated therewith should be read during the valley scan operation for each of the plurality of strings.

6. The memory apparatus as set forth in claim 5, wherein the plurality of strings are arranged horizontally and include a first string and a second string and a third string and a fourth string and a fifth string, the plurality of valley scan bit line selection parameters includes a first string valley scan bit line selection parameter associated with the first string and a second string valley scan bit line selection parameter associated with the second string and a third string valley scan bit line selection parameter associated with the third string and a fourth string valley scan bit line selection parameter associated with the fourth string and a fifth string valley scan bit line selection parameter associated with the fifth string, and the control means is further configured to:

enable the valley scan operation, determine which one of the plurality of strings is being scanned in the valley scan operation, check the first string valley scan bit line selection parameter in response to determining the first string is being scanned in the valley scan operation, pre-charge the odd bit lines coupled to the memory holes of the first string and read the memory cells associated therewith during the valley scan operation in response to the first string valley scan bit line selection parameter indicating the odd bit lines, pre-charge the even bit lines coupled to the memory holes of the first string and read the memory cells associated therewith during the valley scan operation in response to the first string valley scan bit line selection parameter indicating the odd bit lines, check the second string valley scan bit line selection parameter in response to determining the second string is being scanned in the valley scan operation, pre-charge the odd bit lines coupled to the memory holes of the second string and read the memory cells associated therewith during the valley scan operation in response to the second string valley scan bit line selection parameter indicating the odd bit lines, pre-charge the even bit lines coupled to the memory holes of the second string and read the memory cells associated therewith during the valley scan operation in response to the second string valley scan bit line selection parameter indicating the odd bit lines, check the third string valley scan bit line selection parameter in response to determining the third string is being scanned in the valley scan operation, pre-charge the odd bit lines coupled to the memory holes of the third string and read the memory cells associated therewith during the valley scan operation in response to the third string valley scan bit line selection parameter indicating the odd bit lines, pre-charge the even bit lines coupled to the memory holes of the third string and read the memory cells associated therewith during the valley scan operation in response to the third string valley scan bit line selection parameter indicating the even bit lines, check the fourth string valley scan bit line selection parameter in response to determining the fourth string is being scanned in the valley scan operation, pre-charge the odd bit lines coupled to the memory holes of the fourth string and read the memory cells associated therewith during the valley scan operation in response to the fourth string valley scan bit line selection parameter indicating the odd bit lines, pre-charge the even bit lines coupled to the memory holes of the fourth string and read the memory cells associated therewith during the valley scan operation in response to the fourth string valley scan bit line selection parameter indicating the odd bit lines, check the fifth string valley scan bit line selection parameter in response to determining the fifth string is being scanned in the valley scan operation, pre-charge the odd bit lines coupled to the memory holes of the fifth string and read the memory cells associated therewith during the valley scan operation in response to the fifth string valley scan bit line selection parameter indicating the odd bit lines, and pre-charge the even bit lines coupled to the memory holes of the fifth string and read the memory cells associated therewith during the valley scan operation in response to the fifth string valley scan bit line selection parameter indicating the even bit lines.

7. The memory apparatus as set forth in claim 1, further including at least one capacitor coupled to each of the plurality of bit lines and configured to store an electrical charge, and the control means is further configured to pre-charge the at least one capacitor to a pre-charge magnitude and discharge the at least one capacitor through each of the memory cells being read for a sensing time and sense a voltage of the at least one capacitor after the sensing time.

8. A controller in communication with a memory apparatus including memory cells connected to one of a plurality of word lines and disposed in memory holes each coupled to one of a plurality of bit lines, the memory cells configured to retain a threshold voltage corresponding to one of a plurality of data states, the controller configured to:

for a group of the memory cells divided into a plurality of subsets including a first subset and a second subset, instruct the memory apparatus to determine whether fewer read errors of the memory cells arise while pre-charging the plurality of bit lines associated with the first subset or with the second subset; and instruct the memory apparatus to pre-charge only the plurality of bit lines associated with the one of the first and second subsets has been determined to have fewer read errors and then read the memory cells associated therewith during a valley scan operation, wherein the memory holes are organized in rows grouped in a plurality of strings, and for each string, the controller is configured to instruct the memory apparatus to perform said determination for the string and to pre-charge and read only the selected one of the first and second subsets at each of a plurality of reference levels.

9. The controller as set forth in claim 8, further including an error correction algorithm configured to detect the read errors when reading the memory cells and the controller is further configured to:

for the group of the memory cells divided into the plurality of subsets, instruct the memory apparatus to pre-charge ones of the plurality of bit lines associated with one of the plurality of subsets and sense at least some of the memory cells in the one of the plurality of subsets to determine a first quantity of the read errors of the memory cells while pre-charging ones of the plurality of bit lines associated with the one of the plurality of subsets using the error correction algorithm;

for the group of the memory cells divided into the plurality of subsets, instruct the memory apparatus to pre-charge ones of the plurality of bit lines associated with another of the plurality of subsets and sense at least some of the memory cells in the another of the plurality of subsets to determine a second quantity of the read errors of the memory cells while pre-charging ones of the plurality of bit lines associated with the another of the plurality of subsets using the error correction algorithm;

determine whether the first quantity is less than the second quantity;

instruct the memory apparatus to pre-charge ones of the plurality of bit lines associated with the one of the plurality of subsets and read the memory cells associated therewith during the valley scan operation in response to the first quantity being less than the second quantity; and instruct the memory apparatus to pre-charge ones of the plurality of bit lines associated with the another of the plurality of subsets and read the memory cells associated therewith during the valley scan operation in response to the first quantity not being less than the second quantity.

10. The controller as set forth in claim 8, wherein the controller is further configured to instruct the memory apparatus to determine an adjusted read level for at least one of the plurality of data states based on a comparison of reading at one of the plurality of reference levels with results of reading at others of the reference levels.

11. The controller as set forth in claim 10, wherein the plurality of word lines and a plurality of dielectric layers extend horizontally and overlay one another in an alternating fashion in a stack, the memory holes extend vertically through the stack, the memory cells are connected in series between a drain-side select gate transistor on a drain-side of each of the memory holes and connected to the one of the plurality of bit lines and a source-side select gate transistor on a source-side of each of the memory holes and connected to a source line, the memory holes are organized in rows grouped in a plurality of strings, the plurality of bit lines includes even bit lines and odd bit lines alternating with one another, the first subset including memory cells of the memory holes coupled to the even bit lines and the second subset including memory cells of the memory holes coupled to the odd bit lines.

12. The controller as set forth in claim 11, wherein the memory apparatus further includes a plurality of valley scan bit line selection parameters each stored in separate memory addresses and indicative of whether the odd bit lines or even bit lines should be pre-charged and the memory cells associated therewith should be read during the valley scan operation for each of the plurality of strings.

13. The controller as set forth in claim 12, wherein the plurality of strings are arranged horizontally and include a first string and a second string and a third string and a fourth string and a fifth string, the plurality of valley scan bit line selection parameters includes a first string valley scan bit line selection parameter associated with the first string and a second string valley scan bit line selection parameter associated with the second string and a third string valley scan bit line selection parameter associated with the third string and a fourth string valley scan bit line selection parameter associated with the fourth string and a fifth string valley scan bit line selection parameter associated with the fifth string, and the controller is further configured to:

enable the valley scan operation;

determine which one of the plurality of strings is being scanned in the valley scan operation;

check the first string valley scan bit line selection parameter in response to determining the first string is being scanned in the valley scan operation;

instruct the memory apparatus to pre-charge the odd bit lines coupled to the memory holes of the first string and read the memory cells associated therewith during the valley scan operation in response to the first string valley scan bit line selection parameter indicating the odd bit lines;

instruct the memory apparatus to pre-charge the even bit lines coupled to the memory holes of the first string and read the memory cells associated therewith during the valley scan operation in response to the first string valley scan bit line selection parameter indicating the even bit lines;

check the second string valley scan bit line selection parameter in response to determining the second string is being scanned in the valley scan operation;

instruct the memory apparatus to pre-charge the odd bit lines coupled to the memory holes of the second string and read the memory cells associated therewith during the valley scan operation in response to the second string valley scan bit line selection parameter indicating the odd bit lines;

instruct the memory apparatus to pre-charge the even bit lines coupled to the memory holes of the second string and read the memory cells associated therewith during the valley scan operation in response to the second string valley scan bit line selection parameter indicating the odd bit lines;

check the third string valley scan bit line selection parameter in response to determining the third string is being scanned in the valley scan operation;

instruct the memory apparatus to pre-charge the odd bit lines coupled to the memory holes of the third string and read the memory cells associated therewith during the valley scan operation in response to the third string valley scan bit line selection parameter indicating the odd bit lines;

instruct the memory apparatus to pre-charge the even bit lines coupled to the memory holes of the third string and read the memory cells associated therewith during the valley scan operation in response to the third string valley scan bit line selection parameter indicating the odd bit lines;

check the fourth string valley scan bit line selection parameter in response to determining the fourth string is being scanned in the valley scan operation;

instruct the memory apparatus to pre-charge the odd bit lines coupled to the memory holes of the fourth string and read the memory cells associated therewith during the valley scan operation in response to the fourth string valley scan bit line selection parameter indicating the odd bit lines;

instruct the memory apparatus to pre-charge the even bit lines coupled to the memory holes of the fourth string and read the memory cells associated therewith during the valley scan operation in response to the fourth string valley scan bit line selection parameter indicating the even bit lines;

check the fifth string valley scan bit line selection parameter in response to determining the fifth string is being scanned in the valley scan operation;

instruct the memory apparatus to pre-charge the odd bit lines coupled to the memory holes of the fifth string and read the memory cells associated therewith during the valley scan operation in response to the fifth string valley scan bit line selection parameter indicating the odd bit lines; and instruct the memory apparatus to pre-charge the even bit lines coupled to the memory holes of the fifth string and read the memory cells associated therewith during the valley scan operation in response to the fifth string valley scan bit line selection parameter indicating the even bit lines.

14. A method of operating a memory apparatus including memory cells connected to one of a plurality of word lines and disposed in memory holes each coupled to one of a plurality of bit lines, the memory cells configured to retain a threshold voltage corresponding to one of a plurality of data states, the method comprising the steps of:

for a group of the memory cells divided into a plurality of subsets including a first subset and a second subset, determining whether fewer read errors of the memory cells arise while pre-charging the plurality of bit lines associated with the first subset or with the second subset, wherein the memory holes are organized in rows grouped in a plurality of strings, and for each string, performing said determining for the string; and pre-charging only the plurality of bit lines associated with one of the first and second subsets that has been determined, for the corresponding string, to have fewer read errors and then reading the memory cells associated therewith during a valley scan operation at each of a plurality of reference levels of the valley scan operation for the corresponding string.

15. The method as set forth in claim 14, wherein the memory apparatus further includes an error correction algorithm configured to detect the read errors when reading the memory cells and the method further includes the steps of:

for the group of the memory cells divided into the plurality of subsets, pre-charging ones of the plurality of bit lines associated with one of the plurality of subsets and sensing at least some of the memory cells in the one of the plurality of subsets to determine a first quantity of the read errors of the memory cells while pre-charging ones of the plurality of bit lines associated with the one of the plurality of subsets using the error correction algorithm;

for the group of the memory cells divided into the plurality of subsets, pre-charging ones of the plurality of bit lines associated with another of the plurality of subsets and sensing at least some of the memory cells in the another of the plurality of subsets to determine a second quantity of the read errors of the memory cells while pre-charging ones of the plurality of bit lines associated with the another of the plurality of subsets using the error correction algorithm;

determining whether the first quantity is less than the second quantity;

pre-charging ones of the plurality of bit lines associated with the one of the plurality of subsets and reading the memory cells associated therewith during the valley scan operation in response to the first quantity being less than the second quantity; and pre-charging ones of the plurality of bit lines associated with the another of the plurality of subsets and reading the memory cells associated therewith during valley the scan operation in response to the first quantity not being less than the second quantity.

16. The method as set forth in claim 14, wherein the plurality of reference levels includes a plurality of reference levels corresponding with at least one of the plurality of data states, and the method further includes the step of:

determining an adjusted read level for at least one of the plurality of data states based on a comparison of reading at one of the plurality of reference levels with results of reading at others of the reference levels.

17. The method as set forth in claim 14, wherein the plurality of word lines and a plurality of dielectric layers extend horizontally and overlay one another in an alternating fashion in a stack, the memory holes extend vertically through the stack, the memory cells are connected in series between a drain-side select gate transistor on a drain-side of each of the memory holes and connected to the one of the plurality of bit lines and a source-side select gate transistor on a source-side of each of the memory holes and connected to a source line, the memory holes are organized in rows grouped in a plurality of strings, the plurality of bit lines includes even bit lines and odd bit lines alternating with one another, the first subset including memory cells of the memory holes coupled to the even bit lines and the second subset including memory cells of the memory holes coupled to the odd bit lines.

18. The method as set forth in claim 17, wherein the memory apparatus further includes a plurality of valley scan bit line selection parameters each stored in separate memory addresses and indicative of whether the odd bit lines or even bit lines should be pre-charged and the memory cells associated therewith should be read during the valley scan operation for each of the plurality of strings.

19. The method as set forth in claim 18, wherein the plurality of strings are arranged horizontally and include a first string and a second string and a third string and a fourth string and a fifth string, the plurality of valley scan bit line selection parameters includes a first string valley scan bit line selection parameter associated with the first string and a second string valley scan bit line selection parameter associated with the second string and a third string valley scan bit line selection parameter associated with the third string and a fourth string valley scan bit line selection parameter associated with the fourth string and a fifth string valley scan bit line selection parameter associated with the fifth string, and the method further includes the steps of:

enabling the valley scan operation;

determining which one of the plurality of strings is being scanned in the valley scan operation;

checking the first string valley scan bit line selection parameter in response to determining the first string is being scanned in the valley scan operation;

pre-charging the odd bit lines coupled to the memory holes of the first string and reading the memory cells associated therewith during the valley scan operation in response to the first string valley scan bit line selection parameter indicating the odd bit lines;

pre-charging the even bit lines coupled to the memory holes of the first string and reading the memory cells associated therewith during the valley scan operation in response to the first string valley scan bit line selection parameter indicating the even bit lines;

checking the second string valley scan bit line selection parameter in response to determining the second string is being scanned in the valley scan operation;

pre-charging the odd bit lines coupled to the memory holes of the second string and reading the memory cells associated therewith during the valley scan operation in response to the second string valley scan bit line selection parameter indicating the odd bit lines;

pre-charging the even bit lines coupled to the memory holes of the second string and reading the memory cells associated therewith during the valley scan operation in response to the second string valley scan bit line selection parameter indicating the even bit lines;

checking the third string valley scan bit line selection parameter in response to determining the third string is being scanned in the valley scan operation;

pre-charging the odd bit lines coupled to the memory holes of the third string and reading the memory cells associated therewith during the valley scan operation in response to the third string valley scan bit line selection parameter indicating the odd bit lines;

pre-charging the even bit lines coupled to the memory holes of the third string and reading the memory cells associated therewith during the valley scan operation in response to the third string valley scan bit line selection parameter indicating the even bit lines;

checking the fourth string valley scan bit line selection parameter in response to determining the fourth string is being scanned in the valley scan operation;

pre-charging the odd bit lines coupled to the memory holes of the fourth string and reading the memory cells associated therewith during the valley scan operation in response to the fourth string valley scan bit line selection parameter indicating the odd bit lines;

pre-charging the even bit lines coupled to the memory holes of the fourth string and reading the memory cells associated therewith during the valley scan operation in response to the fourth string valley scan bit line selection parameter indicating the even bit lines;

checking the fifth string valley scan bit line selection parameter in response to determining the fifth string is being scanned in the valley scan operation;

pre-charging the odd bit lines coupled to the memory holes of the fifth string and reading the memory cells associated therewith during the valley scan operation in response to the fifth string valley scan bit line selection parameter indicating the odd bit lines; and pre-charging the even bit lines coupled to the memory holes of the fifth string and reading the memory cells associated therewith during the valley scan operation in response to the fifth string valley scan bit line selection parameter indicating the even bit lines.

20. The method as set forth in claim 14, wherein the memory apparatus further includes at least one capacitor coupled to each of the plurality of bit lines and configured to store an electrical charge, and the method further includes the step of pre-charging the at least one capacitor to a pre-charge magnitude and discharging the at least one capacitor through each of the memory cells being read for a sensing time and sensing a voltage of the at least one capacitor after the sensing time.

* * * * *